US007471545B2

(12) United States Patent
Nii

(10) Patent No.: US 7,471,545 B2
(45) Date of Patent: Dec. 30, 2008

(54) SEMICONDUCTOR MEMORY DEVICE

(75) Inventor: Koji Nii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 170 days.

(21) Appl. No.: 11/445,468

(22) Filed: Jun. 2, 2006

(65) Prior Publication Data

US 2006/0289945 A1    Dec. 28, 2006

(30) Foreign Application Priority Data

Jun. 3, 2005    (JP)    ............................. 2005-163641

(51) Int. Cl.
*G11C 11/00*    (2006.01)
(52) U.S. Cl. .................... 365/154; 156/205; 156/230.09
(58) Field of Classification Search ................. 365/156, 365/154, 205, 230.09
See application file for complete search history.

(56) References Cited

U.S. PATENT DOCUMENTS

| | | | | |
|---|---|---|---|---|
| 5,324,982 | A | * | 6/1994 | Nakazato et al. ............ 257/546 |
| 5,590,068 | A | * | 12/1996 | Bergemont ................... 365/63 |
| 6,657,911 | B2 | * | 12/2003 | Yamaoka et al. ............ 365/226 |
| 6,980,462 | B1 | * | 12/2005 | Ramesh et al. .............. 365/154 |

FOREIGN PATENT DOCUMENTS

| | | |
|---|---|---|
| JP | 2001-028401 | 1/2001 |
| JP | 2002-043441 | 2/2002 |
| JP | 2002-237539 | 8/2002 |
| JP | 2003-060089 | 2/2003 |
| JP | 2003-297953 | 10/2003 |
| JP | 2004-200300 | 7/2004 |

OTHER PUBLICATIONS

Technical Report of the Institute of Electronics, Information and Communication Engineers of Japan, vol. 104, No. 66, "Development of Dual Port SRAM for SoC Using 90 nm Technology achieving Increase in Integration and Reduction in Power," May 20, 2004, Nii et al.
ISSCC2004, Digest of Technical Papers "A 90 nm Dual-Port SRAM with 2.04 µm² 8T-Thin Cell Using Dynamically-Controlled Column Bias Scheme," Feb. 18, 2004, Nii et al.
Nii, et al., "Development of Dual Port SRAM for SoC Using 90 nm Technology achieving Increase in Integration and Reduction in Power," Technical Report of the Institute of Electronics, May 20, 2004, vol. 104, No. 66, Information and Communication Engineers of Japan.
Nii, et al., "A 90 nm Dual-Port SRAM with 2.04 µm² 8T-Thin Cell Using Dynamically-Controlled Column Bias Scheme," Digest of Technical Papers, Feb. 18, 2004, ISCC2004.

* cited by examiner

*Primary Examiner*—Amir Zarabian
*Assistant Examiner*—Jason Lappas
(74) *Attorney, Agent, or Firm*—McDermott Will Emery LLP

(57) ABSTRACT

Source contacts of driver transistors are short-circuited through the use of an internal metal line within a memory cell. This metal line is isolated from memory cells in an adjacent column and extends in a zigzag form in a direction of the columns of memory cells. Individual lines for transmitting the source voltage of driver transistors can be provided for each column, and the source voltage of driver transistors can be adjusted also in units of memory cell columns in the structure of single port memory cell.

11 Claims, 17 Drawing Sheets

SEMICONDUCTOR MEMORY DEVICE

BACKGROUND OF THE INVENTION

1. Field of the Invention

The present invention relates to a semiconductor memory device, and in particular, to a static type semiconductor memory device in which a memory cell has a flip-flop configuration. Specifically, the present invention relates to a layout of memory cells for reducing the power dissipation of the static type semiconductor memory devices.

2. Description of the Background Art

Semiconductor integrated circuit devices of high performance, such as system LSI's (large scale integrated circuits) or systems on chips (SOC), have been implemented with development of miniaturization technology. In such semiconductor integrated circuit devices, a logic circuit for executing a process, such as a processor, and a memory for storing data and program information used by the logic circuit are integrated on the same semiconductor chip. Such large scale integrated circuit devices are used in image processing, communication processing and others. In image processing and communication processing, it is required to process a large amount of data at high speed, and a memory that is assembled in the integrated circuit device is required to have an increased memory capacity.

In the case where the memory capacity of a memory (semiconductor memory device) is increased, it is required to arrange memory cells with high density without increasing the chip layout area, in view of suppressing an increase in cost, compatibility with devices of the previous generation and others. A structure in which substrate regions (well regions) for placing memory cell transistors are arranged extending linearly in column direction and the diffusion regions of the memory cells are formed into a linear, rectangular form, in order to arrange memory cells with high density is disclosed in Document 1 (Japanese Patent Laying-Open No. 2002-043441), Document 2 (Japanese Patent Laying-Open No. 2003-297953), Document 3 (Japanese Patent Laying-Open No. 2003-060089) and Document 4 (Japanese Patent Laying-Open No. 2001-028401).

In the layout of the memory cells shown in these Documents 1 to 4, access transistors and driver transistors which are formed of n channel MOS transistors (insulating gate type field effect transistors) are placed within P wells, and load transistors which are formed of p channel MOS transistors are placed within N wells which are formed adjacent to these P wells. Bit lines, power supply lines and ground lines are provided parallel to well regions in the column direction, and the power supply lines and the ground lines are connected to the source nodes of the load transistors and the source nodes of the driver transistors, respectively, in corresponding columns of memory cells. These references aim to simplify the interconnection layout and enable miniaturization of transistors by making the well regions extend linearly, and further to reduce the gate length of the transistors or the distance between the access transistors of the memory cells and the bit lines for reducing the interconnection resistance.

Where a memory device having a large memory capacity is implemented, it is required for the consumed power to be suppressed as much as possible, in terms of heat generation, battery life (in the case of application in portable equipments), and others. A configuration intending to reduce the current dissipation at standby and in operation is disclosed in Reference 1 (Technical Report of the Institute of Electronics, Information and Communication Engineers of Japan, Vol. 104, No. 66, "Development of Dual Port SRAM for SoC Using 90 nm Technology achieving Increase in Integration and Reduction in Power," Nii et al.) and Reference 2 (ISSCC2004, Digest of Technical Papers "A 90 nm Dual-Port SRAM with 2.04 $\mu m^2$ 8T-Thin Cell Using Dynamically-Controlled Column Bias Scheme," Nii et al.).

These References 1 and 2 disclose the same technical content: the voltage of the source line (ground line) that is connected to the driver transistors in a memory cell column unit is controlled for each column in a dual port SRAM. Specifically, the source voltage VSL of the driver transistors in unselected columns of memory cells is set at, for example, 0.4 V at a higher voltage level, while the source voltage of the driver transistors of memory cells in the selected column is driven to a ground voltage level. The gate to source bias of the driver transistors in the unselected memory cells is set into a reversed bias state, to make the driver transistor to be a deeper off state, so that the sub-threshold leakage current and the gate leakage current are reduced, and accordingly, the consumed current at standby is reduced.

The source line of the driver transistors is at the ground voltage level in the memory cell in the selected column and row, and in readout, the potential of the bit line is discharged in accordance with the stored data. In the memory cells in the selected column and unselected rows, only a leakage current which is smaller than the column current flows, and substantially negligible, as compared to the operation current. Furthermore, in the memory cells in the selected row and unselected columns, the driver transistor has the voltage between the gate and the source set to a reversed bias state, so that the bit lines are subject to substantially no discharging, the column current is suppressed and the consumed current in operation is reduced.

In the interconnection layout in the configuration shown in Documents 1, 2 and 4, power supply lines are placed in the center portion of memory cell regions, and ground lines are placed outside bit lines. Accordingly, ground lines are shared by memory cells in adjacent columns, and thus, the ground voltage cannot be controlled in units of columns, and the configuration in the above described References 1 and 2, in which the standby current and the operation current are reduced, cannot be applied.

In Document 3, FIG. 7 shows an interconnection layout where a ground line is placed in the center portion of memory cell and power supply line is placed outside bit lines. In this interconnection layout, ground lines is laced for each column, and thus, it is possible to adjust the potential of the ground lines for each column. However, in P well which is placed in the center portion of memory cell, an active region for forming two access transistors and two driver transistors is formed in rectangular form extending in the column direction. Four transistors are placed to be aligned in the column within the active region. Although the gates of these transistors extend in the row direction to simplify the interconnection layout, the pitch of memory cells in the column direction becomes the pitch of four transistors, and such a problem arises that the size of the memory cells in the column direction is large, as compared to a memory cell layout in which a pair of load transistors are placed in the center portion of memory cell region.

In addition, in the above described References 1 and 2, a ground line is placed between a pair of bit lines for each port, and a power supply line is placed between bit lines for different ports in a dual port SRAM. Accordingly, it becomes possible to use power supply lines and ground lines as shielding layers for bit lines, and the voltage level of ground lines can be adjusted for each column. In this configuration, however, load transistors are placed in N well in the center portion of memory cell region, and in the P wells on both sides, a pair of access transistors for the same port and one driver transistor are placed for each port, and a pair of bit lines for different ports are placed opposing to each other with respect to the center portion. Accordingly, the ground lines are arranged utilizing the memory cell configuration in the dual port SRAM, and thus, the arrangement of the ground lines in References 1 and 2 cannot be used simply directly in a single port SRAM.

It is frequently required to make simultaneous access via two ports for performing processes in an SOC or the like oriented to image processing and communication processing, and such parallel processing can be achieved using a dual port SRAM memory as described above. At present, however, a single port SRAM is generally used in an application such as a cache memory, and thus, a configuration where the potential of the source lines of the driver transistors for each column can be controlled without increasing the size of memory cells is also required in single port SRAM's. References 1 and 2 only discussed dual port SRAM's, and does not discuss single port SRAM's.

SUMMARY OF THE INVENTION

An object of the present invention is to provide a semiconductor memory device in which the power dissipation in operation and in standby can be reduced while suppressing increase in size of memory cells.

Another object of the present invention is to provide a static type semiconductor memory device in which the potential of low side source lines can be set for each memory cell column in either configurations of single port and multi-port.

A semiconductor memory device according to the present invention includes a plurality of memory cells aligned in rows and columns, a plurality of word lines arranged corresponding to the respective memory cell rows and each connecting to the memory cells in a corresponding row, a plurality of bit lines arranged corresponding to memory cell columns and each connecting to the memory cells in a corresponding column, and a second power supply line for supplying a second power supply voltage.

Each memory cell includes a pair of load transistor elements of a second conductivity type that are formed in a first substrate region of a first conductivity type and have each first conduction node connected to a power supply node for supplying a first power supply voltage, driver transistor elements of the first conductivity type which are formed in respective second substrate regions of the second conductivity type arranged on opposing sides of the first substrate region of the first conductivity type and are connected to form a flip-flop with the load transistor elements and having first conduction nodes connected to receive the second power supply voltage. The second power supply line is arranged continuously extending in a column direction for each memory cell column and formed crossing the first substrate region in each memory cell, for supplying the second power supply voltage and connecting the first conduction nodes of the driver transistor elements in a corresponding memory cell.

In each memory cell, the source nodes (first conduction node) of the driver transistor elements are connected via the second power supply line for supplying the second power supply voltage. This second power supply line is formed so as to cross the first substrate region where the load transistor elements are placed. Accordingly, the second power supply line can be individually placed for each memory cell column, so that the voltage control of the low side source line can be dynamically performed in a memory cell column unit, and accordingly, the power consumption at standby and in operation can be reduced.

In addition, in each memory cell, the low side source node of the driver transistor elements are short-circuited via the second power supply line, and the difference in the low side source potential between the driver transistor elements can be made minimum, so that the margin for stable operation of the memory cells can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
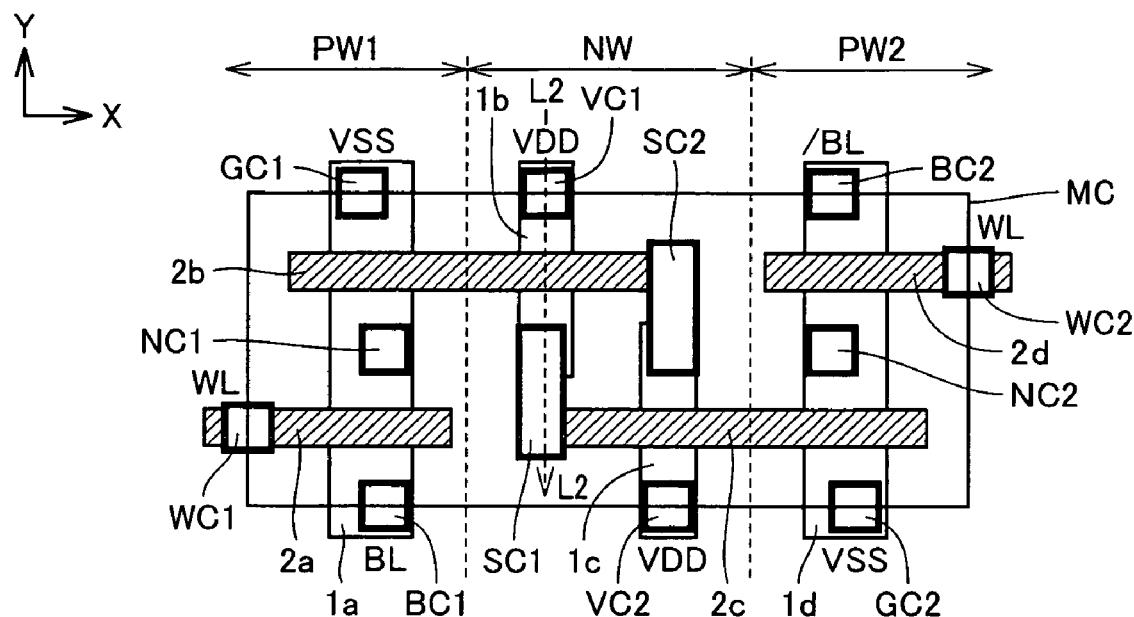
FIG. 1 is a diagram schematically showing an interconnection layout from the substrate to contacts in a memory cell according to the first embodiment of the present invention.

FIG. 1 is a diagram schematically showing the layout of a memory cell in the semiconductor memory device according to the first embodiment of the present invention. FIG. 1 schematically shows the layout of active regions in which transistors are formed, polysilicon layers and contacts. Memory cell MC shown in FIG. 1 is a single port memory cell and stores information of one bit.

In FIG. 1, an n type semiconductor substrate region (N well) NW is arranged linearly extending in Y direction, and p type substrate regions (P well) PW1 and PW2 are arranged on both sides of N well NW. Load transistors are formed in N well NW, and an access transistor and a driver transistor are placed in each of P wells PW1 and PW2. These wells NW, PW1 and PW2 are arranged continuously extending in X direction the columns, and memory cells are aligned in one column are formed in these wells NW, PW1 and PW2.

In P well PW1, an active region 1a in rectangular form is formed extending in the Y direction. Polysilicon lines 2a and 2b which form word lines are provided in X direction X so as to cross active region 1A. Polysilicon line 2a is placed in P well PW1 (and extends into a memory cell region in an adjacent column), and polysilicon line 2b extends to the inside of N well NW.

A contact NC1 for forming a storage node is disposed between polysilicon lines 2a and 2b. A bit line contact BC1 for making contact with a bit line BL is disposed in an end portion of active region 1a that is outside of polysilicon line 2a, and a source contact GC1 for making contact between active region 1a and a low side power supply (source) line (VSS source line) is formed in the opposite end portion of active region 1a.

In N well NW, active regions 1b and 1c in rectangular form extending in Y direction are formed being apart from each other and displaced in Y direction. Polysilicon line 2b is arranged extending in the X direction and crossing active region 1b. A polysilicon line 2c is arranged extending in the X direction to cross active region 1c. A power supply contact VC1 for making contact with a high side power supply line (VDD source line) is formed at one end portion in active region 1b. In the portion of active region 1b on the opposite end of polysilicon line 2b, shared contact SC1 for making shared contact with polysilicon line 2c is formed. By using shared contact SC1, electrical connection is made with both active region 1b and polysilicon line 2c.

Similarly, a power supply contact VC2 for making contact with VDD source line is formed in active region 1c on the outside of polysilicon line 2c, and a shared contact SC2 is disposed in the portion of active region 1c on the opposite side of polysilicon line 2c, so that active region 1c and polysilicon line 2b are electrically connected with each other.

In P well PW2, an active region 1d in rectangular form is arranged extending in the Y direction, as in P well PW1. A source contact GC2 for the VSS source line and a bit line contact BC2 for a bit line /BL are formed in active region 1d in positions symmetrical to those in active region 1a. In addition, a contact NC2 for forming a storage node is formed in the center region of active region 1d in Y direction (within one memory cell). A polysilicon line 2d is formed extending in X direction between contacts BC2 and NC2. This polysilicon line 2d extends within P well PW2 (and extends to an adjacent column; the memory cell in the adjacent column is not shown). Polysilicon line 2c is arranged continuously extending from shared contact SC1 in the N well in X direction between contacts NC2 and GC2.

A contact WC2 for making contact with a word line WL is formed for polysilicon line 2d.

Figure 2:
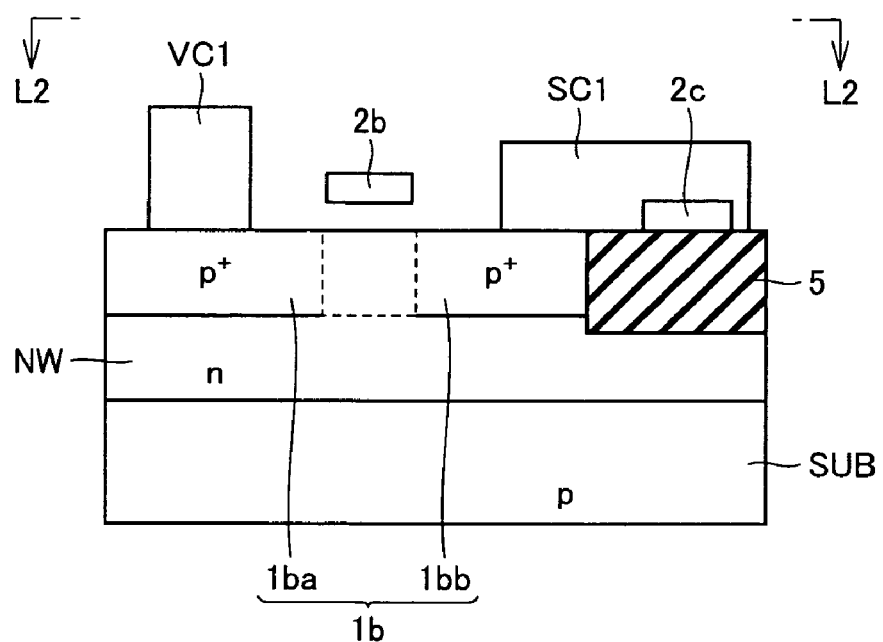
FIG. 2 is a diagram schematically showing a cross sectional structure of the contacts and shared contacts shown in FIG. 2.

FIG. 2 is a diagram schematically showing a cross sectional structure of active region 1b along broken line L2-L2 of FIG. 1 in Y direction. In FIG. 2, N well NW is formed on a p type semiconductor substrate SUB, and active region 1b is formed at the surface of this N well NW. An element isolation film (field insulating film) 5 is formed in one end portion of active region 1b, which in turn is isolated from other transistor active regions. In active region 1b, high concentration impurity regions 1ba and 1bb are formed apart from each other. Polysilicon line 2b is provided on the surface of N well NW between these impurity regions 1ba and 1bb. Impurity region 1ba is electrically connected to power supply contact VC1. This impurity region 1ba is shared by a memory cell adjacent in Y direction, and no element isolation film is formed in this impurity region 1ba.

Although a silicide film, such as cobalt silicide (CoSi) or nickel silicide (NiSi) is usually formed between contact VC1 and impurity region 1ba as a barrier layer, in FIG. 2, this silicide film is not shown. This holds for impurity region 1bb.

Polysilicon line 2c is provided on element isolation film 5. Shared contact SC1 which is electrically connected to impurity region 1bb is electrically connected to the polysilicon line 2c. Accordingly, impurity region 1bb and polysilicon line 2c are electrically connected via shared contact SC1. No interconnection line in another interconnection layer for electrically connecting impurity region 1bb and polysilicon line 2c is necessary, simplifying the interconnection layout, and in addition, interconnection layout can be made with sufficient margin in the upper interconnection layer. In addition, by providing shared contacts SC1 and SC2, all the contacts can be formed in the same manufacturing process step (only shared contacts SC1 and SC2 have different forms from other contacts in a plan view).

Here, impurities may be implanted at the surface region of N well NW beneath polysilicon line 2b through counter-doping for adjusting the threshold voltage of the MOS transistor or the like.

Figure 3:
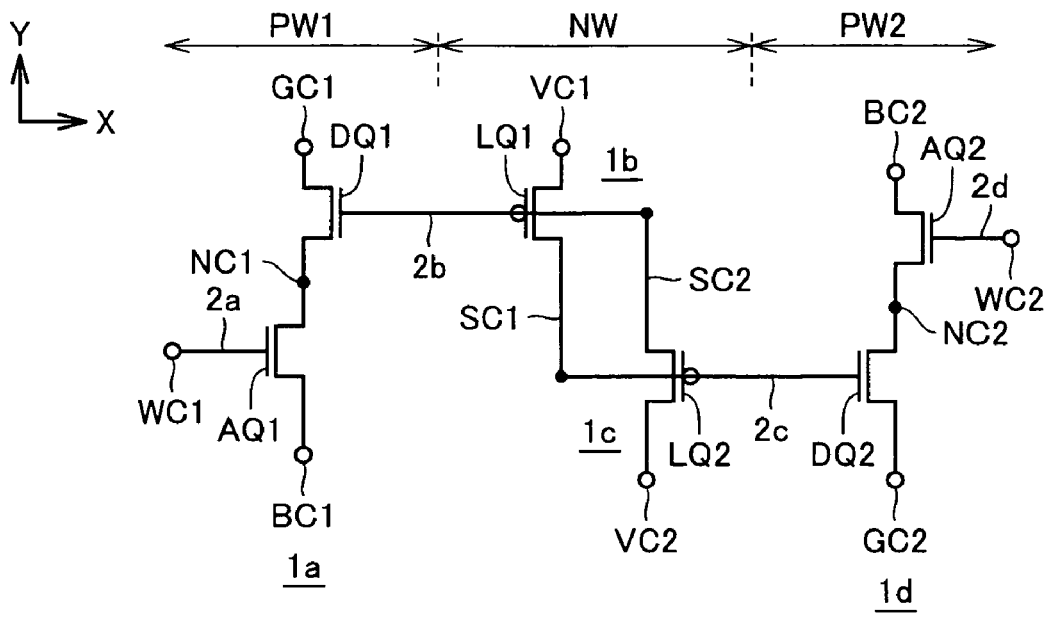
FIG. 3 is a diagram showing the connection of transistors in the interconnection layout shown in FIG. 1.

FIG. 3 is an electrical equivalent circuit diagram showing the arrangement of transistors in the memory cell shown in FIG. 1. In FIG. 3, a driver transistor DQ1 and an access transistor AQ1 are formed within active region 1a in P well PW1. Driver transistor DQ1 has a source node connected to contact GC1, a drain node connected to contact NC1, and a gate formed of polysilicon line 2b. Access transistor AQ1 is placed between contact NC1 and bit line contact BC1, and has a gate formed of polysilicon line 2a connected to a contact WC1.

In N well NW, a load transistor LQ1 is formed by a P channel MOS transistor within active region 1b, and a load transistor LQ2 is formed by a Pchannel MOS transistor within active region 1c. Load transistor LQ1 has a source node connected to power supply contact VC1, and a drain node connected to polysilicon line 2c via shared contact SC1. The gate of load transistor LQ1 is formed of polysilicon line 2b. Polysilicon line 2b is connected to the drain node of load transistor LQ2 via shared contact SC2. Load transistor LQ2 has a source node connected to power supply contact VC2, and a gate formed of polysilicon line 2d.

In P well PW2, an access transistor AQ2 and a driver transistor DQ2 are each formed by an N channel MOS transistor within active region 1d. The gate of access transistor AQ2 is formed of polysilicon line 2d, and this polysilicon line 2d is connected to a contact WC2. The two conduction nodes of access transistor AQ2 are connected to contacts BC2 and NC2, respectively. Driver transistor DQ2 is placed between contact GC2 and contact NC2, and has a gate formed of polysilicon line 2c.

Accordingly, in each of P wells PW1 and PW2, two N channel MOS transistors are formed and aligned within active regions 1a and 1d. In N well NW, load transistors LQ1 and LQ2 are respectively formed within active regions 1b and 1c which in turn are separately provided. Accordingly, the pitch of memory cells in Y direction is a pitch corresponding to two transistors, and increase in the size of the memory cell in Y direction is suppressed.

Figure 4:
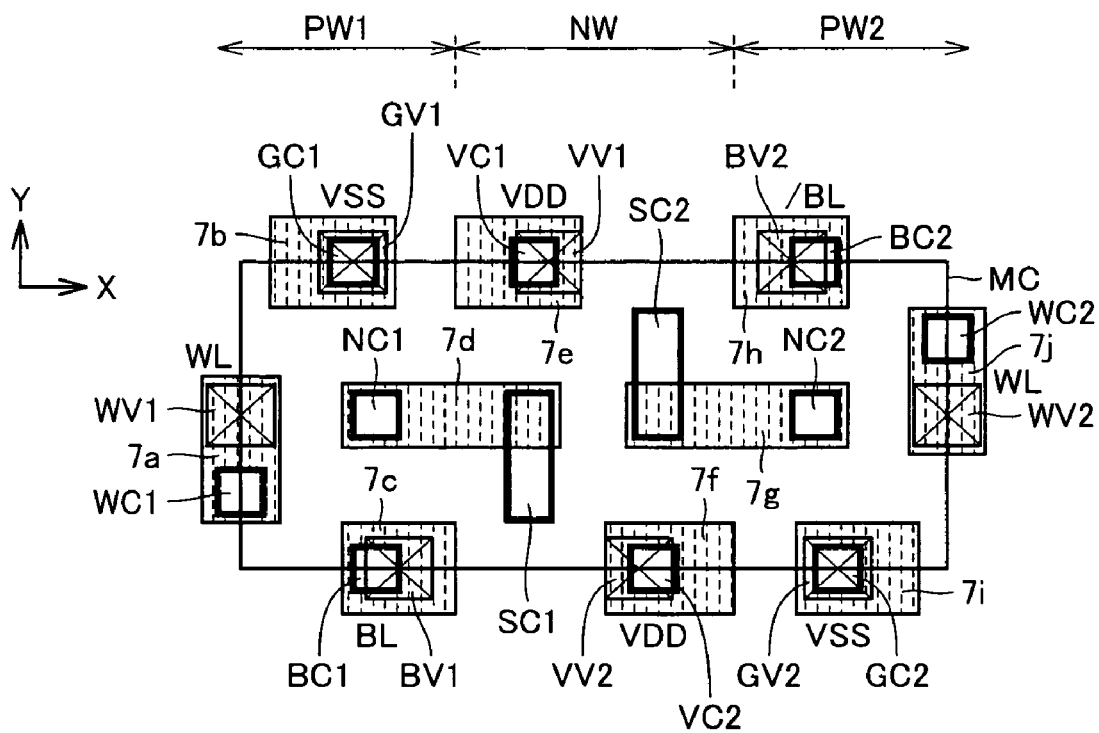
FIG. 4 is a diagram showing an interconnection layout in a layer above the interconnection layout shown in FIG. 1.

FIG. 4 is a diagram schematically showing the layout of contacts and first metal lines in an upper layer in the layout of memory cell MC of FIG. 1. In FIG. 4, the same reference numerals are allotted to the contacts that are the same as those shown in FIG. 1, and detailed descriptions of these are not repeated.

A first metal line 7a for contact WC1 is formed in rectangular form extending in Y direction. A via WV1 is formed for this first metal line 7a. A first metal line 7b is provided for contact GC1. A via GV1 is formed for this first metal line 7b so as to substantially overlap contact GC1. For contact NC1, a first metal line 7d is formed in rectangular form extending to shared contact SC1 in X direction.

A first metal line 7c is provided for contact BC1. A via BV1 is formed for first metal line 7c such that a portion thereof overlaps the contact BC1 in a plan view.

A first metal line 7e is provided for power supply contact VC1. A via VV1 is formed for this first metal line 7e such that a portion thereof overlaps contact VC1.

A first metal line 7f is formed for contact VC2. A via Vv2 is formed for first metal line 7f so as to overlap contact VC2. A first metal line 7g for shared contact SC2 and contact NC2 is formed in rectangular form extending in X direction.

A first metal line 7h is formed for contact BC2, and a via BV2 is formed above this first metal line 7h such that a portion thereof overlaps contact BC2.

A first metal line 7i is formed for contact GC2, and in addition, a via GV2 is formed for this first metal line 7i so as to overlap contact GC2.

A first metal line 7j in rectangular form having long sides in Y direction is formed for contact WC2. A via WV2 is provided for this first metal line 7j. These vias WV1, WV2, BV1, BV2, GV1, GV2, VV1 and VV2 are provided for making electrical contact with second metal lines which are formed above these first metal lines.

First metal lines 7a to 7j shown in FIG. 4 extend only within the memory cell and are used as interconnection lines for making electrical contact with internal storage nodes or making contact with interconnection lines in an upper layer.

Sspecifically, in the electrical equivalent circuit shown in FIG. 3, through the use of first metal lines 7a to 7j, node NC1 is coupled to shared node SC1, the gates of load transistor LQ2 and driver transistor DQ2 are commonly connected to the internal node (storage node; contact NC1), contact NC2 is connected to shared contact SC2, and the other storage node is connected to the gates of driver transistor DQ1 and load transistor LQ1.

First metal lines 7b and 7i are connected to the VSS source lines (low side power supply line), respectively, but are not shared by adjacent memory cells in X direction. Memory cells are arranged in mirror symmetry with respect to the boundary line between the memory cells (in both directions of X and Y). First metal lines 7b and 7i, however, are provided to have gaps with the corresponding first metal lines in an adjacent memory cell, and are isolated from corresponding first metal lines in memory cells in adjacent columns when arranged in mirror symmetry.

Figure 5:
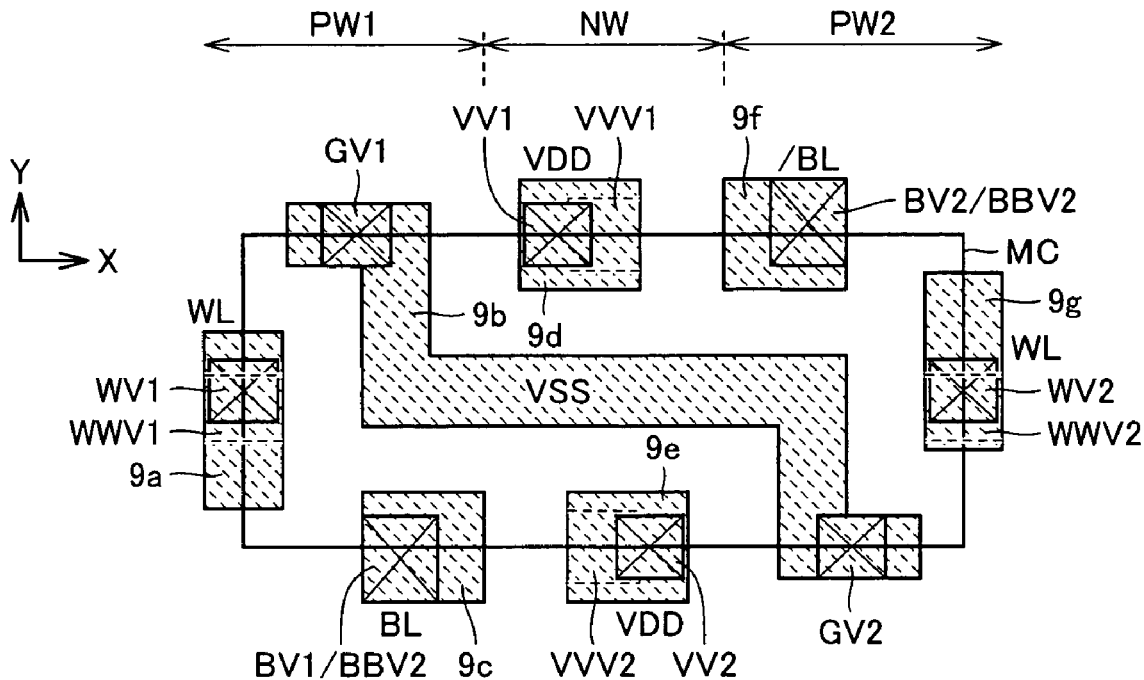
FIG. 5 is a diagram schematically showing the layout of second metal interconnection lines in a layer above the interconnection layout shown in FIG. 4.

FIG. 5 is a diagram schematically showing the interconnection layout in an upper layer which corresponds to the interconnection layout of the memory cell shown in FIG. 4. FIG. 5 shows the arrangement of the second metal lines and the corresponding vias, and the same reference numerals are attached to contacts that are the same as those shown in FIG. 4, and the detailed descriptions thereof are not repeated.

In FIG. 5, for contact WV1, a second metal line 9a is arranged in a rectangular form extending within the memory cell region in Y direction. For this second metal line 9a, a second via WWV1 is formed having a portion thereof overlapping via WV1. A second metal line 9c is provided for via BV1. For second metal line 9c, a second via BBV2 is provided overlapping via BV1. A second metal line 9d is provided for via VV1. In addition, a second metal line 9e is provided for via VV2. Second vias VVV1 and VVV2 are provided for second metal lines 9d and 9e, respectively, and are aligned in Y direction.

A second metal line 9f is provided for via BV2, and a second via BBV2 is provided above this second metal line 9f.

A second metal line 9g is provided for via WV2. For this second metal line 9g, a second via WWV2 is provided being aligned with second via WWV1 that is provided for second metal line 9a in X direction X.

A second metal line 9b is formed extending continuously in a step form between vias GV1 and GV2. The second metal layer 9b has portions which linearly extend in the directions of X and Y, and has a L-shaped form point symmetrical relative to the center portion and is connected to vias GV1 and GV2 on both ends.

Accordingly, nodes of the two driver transistors which are connected to the VSS source line are connected to each other via second metal line 9b in memory cell MC. Second metal line 9b extends crossing the N well (not shown in FIG. 5) within memory cell MC in X direction and short-circuits the source nodes of the driver transistors only within the memory cell. Specifically, second metal line 9b extends linearly in the directions of Y and X, and electrically connects vias GV1 and GV2 which correspond to the source nodes of the driver transistors over the shortest distance. Second metal line 9b extends only within memory cell MC, and is separated from corresponding second metal lines 9b within memory cells that are adjacent in X direction.

Figure 6:
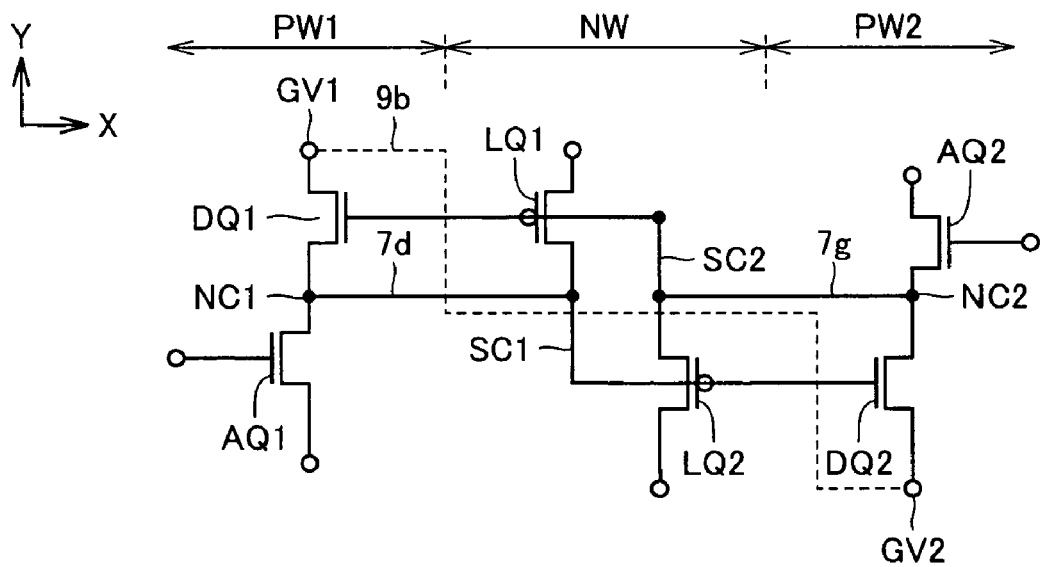
FIG. 6 is a diagram showing the electrical connection of transistors in the interconnection layout shown in FIG. 5.

FIG. 6 is an electrical equivalent circuit diagram showing the connection of transistors in a memory cell at the time of completion of the layout shown in FIG. 5. In FIG. 6, internal node NC1 is connected to shared node (contact) SC1 by means of first metal line 7d shown in FIG. 4, and internal node NC2 is connected to shared node (contact) SC2 by means of first metal line 7g. The gates of transistor LQ2 and driver transistor DQ2 are connected to contact NC1 which corresponds to a storage node by means of first metal line 7d, and the gates of load transistor LQ1 and driver transistor DQ1 are connected to contact NC2 which corresponds to another storage node.

The source node of driver transistor DQ1 is connected to via GV2 of the VSS source node of driver transistor DQ2 through via GV1 and second metal line 9b. Second metal line 9b is an interconnection line in a layer above first metal lines 7d and 7g, and as shown in FIG. 5, these metal lines 9b, 7d and 7g are arranged overlapping each other in a plan view.

Here, the gate node and one of the conduction nodes of each of access transistors AQ1 and AQ2, as well as the source nodes of load transistors LQ1 and LQ2, are connected through associated vias, and as shown in FIG. 5, these vias are formed for making electrical contacts with the interconnection lines in an upper layer, and FIG. 6 does not explicitly show the portions where these nodes are connected, since the connection destinations are not yet formed.

As shown in FIG. 6, second metal line 9b is formed linearly in a step form crossing N well NW in X direction within the memory cell, and thereby, the source nodes of driver transistors DQ1 and DQ2 can be short-circuited over the shortest distance, so that difference in potential between the VSS source nodes of the driver transistors can be prevented within the memory cell.

Figure 7:
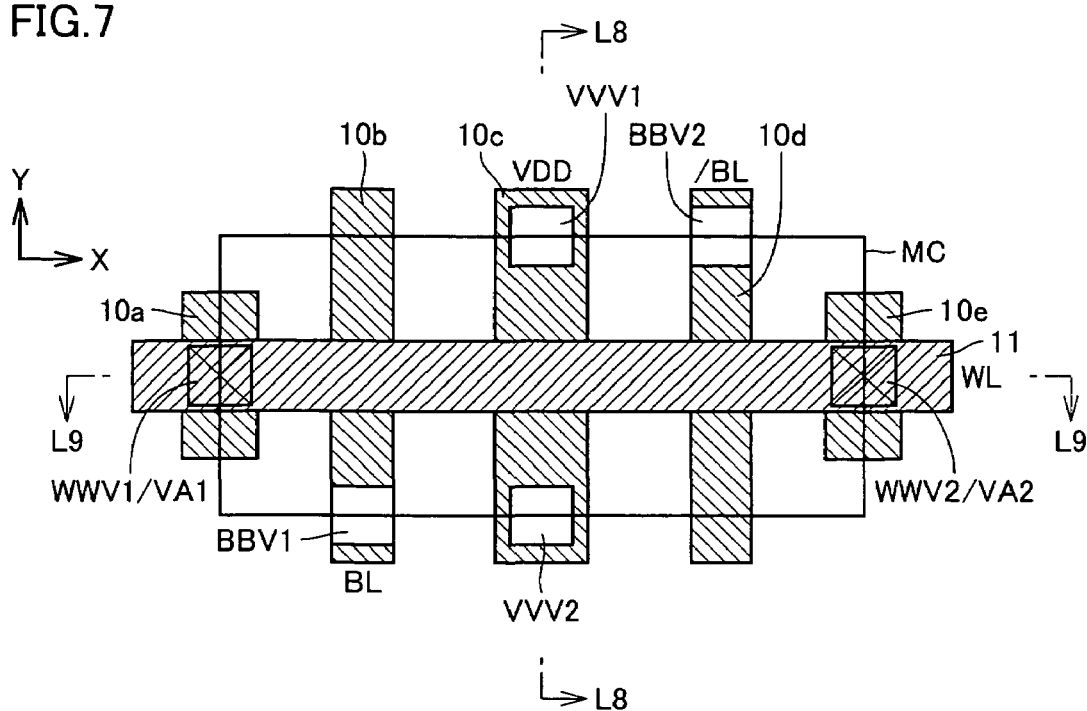
FIG. 7 is a diagram showing the layout of third metal lines in a layer above the interconnection layout shown in FIG. 5.

FIG. 7 is a diagram schematically showing the layout of the third and fourth metal lines which are arranged in layers above the interconnection layout shown in FIG. 5. In FIG. 7, for via WWV1, a third metal line 10a is provided in a rectangular form extending in Y direction within memory cell MC. For second via BBV1, a third metal line 10b is provided continuously extending in Y direction, and forms a bit line BL.

A third metal line 10c is provided for vias VVV1 and VVV2. This third metal line 10c continuously extends in Y direction and supplies a high side source voltage (power supply voltage) VDD to memory cells which are provided in the corresponding column.

For bit line via BBV2, a third metal line 10d is provided continuously extending in Y direction, and forms a bit line /BL. For via WWV2, a third metal line 10e is provided in a rectangular form extending in Y direction within memory cell MC. A fourth metal line 11 is provided, for third metal lines 10a and 10e, continuously extending in X direction. Fourth metal line 11 is connected to third metal lines 10a and 10e through vias VA1 and VA2 which are formed overlapping vias WWV1 and WWV2, respectively. This fourth metal line 11 forms a word line WL for memory cells which are aligned in X direction, and the gates of access transistors AQ1 and AQ2 in the memory cells that are aligned in X direction are connected commonly.

As shown in FIG. 7, the third metal lines are not used as interconnection lines for transmitting a low side power supply voltage (source voltage) VSS. The source nodes of the driver transistors (VSS) in a memory cell are connected to each other via a second metal line. The third metal lines for transmitting low side power supply voltage VSS become unnecessary above memory cell MC, and in this third metal line layer, necessary lines can be arranged with margin in the interconnection layout pitch.

Figure 8:
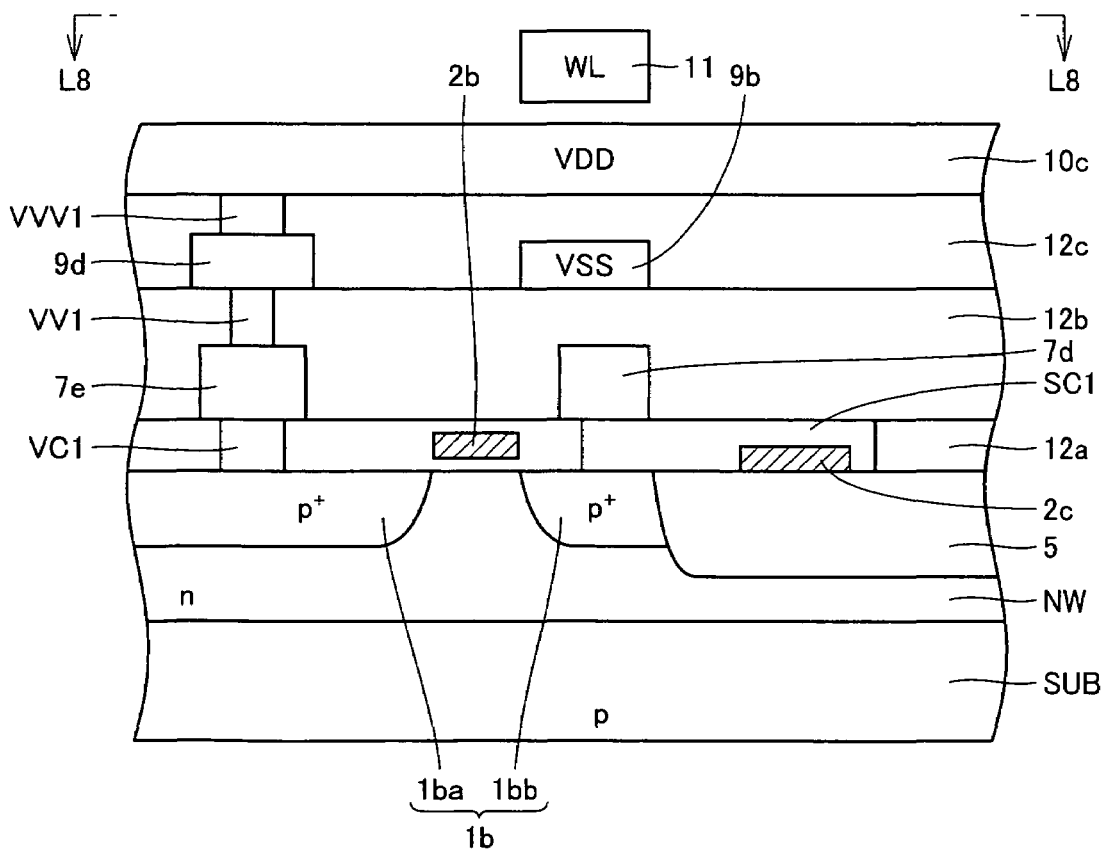
FIG. 8 is a diagram schematically showing a cross sectional structure along line L8-L8 of FIG. 7.

FIG. 8 is a diagram schematically showing a cross sectional structure along line L8-L8 of FIG. 7. In FIG. 8, N well NW is formed on the surface of p type semiconductor substrate SUB. P type impurity regions 1ba and 1bb are formed apart from each other on the surface of N well NW. These impurity regions 1ba and 1bb are included in active region 1b shown in FIG. 1. Element isolation film 5 is formed on the surface of N well NW so as to be adjacent to impurity region 1bb. In addition, polysilicon line 2b is formed on the surface of N well NW between impurity regions 1ba and 1bb with a gate insulating film in between.

Polysilicon line 2c is formed on element isolation film 5, and this polysilicon line 2c is connected to impurity region 2c via shared contact SC1. Impurity region 1b is coupled to contact VC1. The structure from the substrate to contact VC1 and shared contact SC1 is the same as that shown in FIG. 2.

Here, shared contact SC1, polysilicon line 2b and contact VC1 are electrically isolated from each other by means of an interlayer insulating film 12a.

First metal line 7e is formed being connected to contact VC1, and first metal line 7d is formed being connected to shared contact SC1. These first metal lines 7e and 7d are electrically isolated from each other by means of an interlayer insulating film 12b. A via hole which reaches first metal line 7e is formed in this interlayer insulating film 12b using a photolithographic process (photochemical engraving and etching process), and then, this via hole is filled with a conductive material, and thereby, first via VV1 that is electrically connected to first metal line 7e is formed.

Second metal lines 9d and 9b are formed, on interlayer insulating film 12b, aligning with first metal lines 7e and 7d. Second metal lines 9b and 9d are electrically isolated from each other by means of an interlayer insulating film 12c.

Third metal line 10c is arranged on interlayer insulating film 12c, and second via VVV1 which is formed in interlayer insulating film 12c electrically connects second metal line 9d and a third metal line 10d, so that high side power supply voltage VCC is supplied to impurity region 1ba in a lower layer. Fourth metal line 11 is provided in a layer above this third metal line 10c in the direction crossing the third metal line.

As can be seen from this FIG. 8, the VSS source line which connects the source nodes of memory cells to each other is formed of second metal line 9b, and thus, the memory cell source node interconnecting line can be placed within a memory cell without adversely effecting the internal interconnection line of the memory cell and the layout of word lines.

Figure 9:
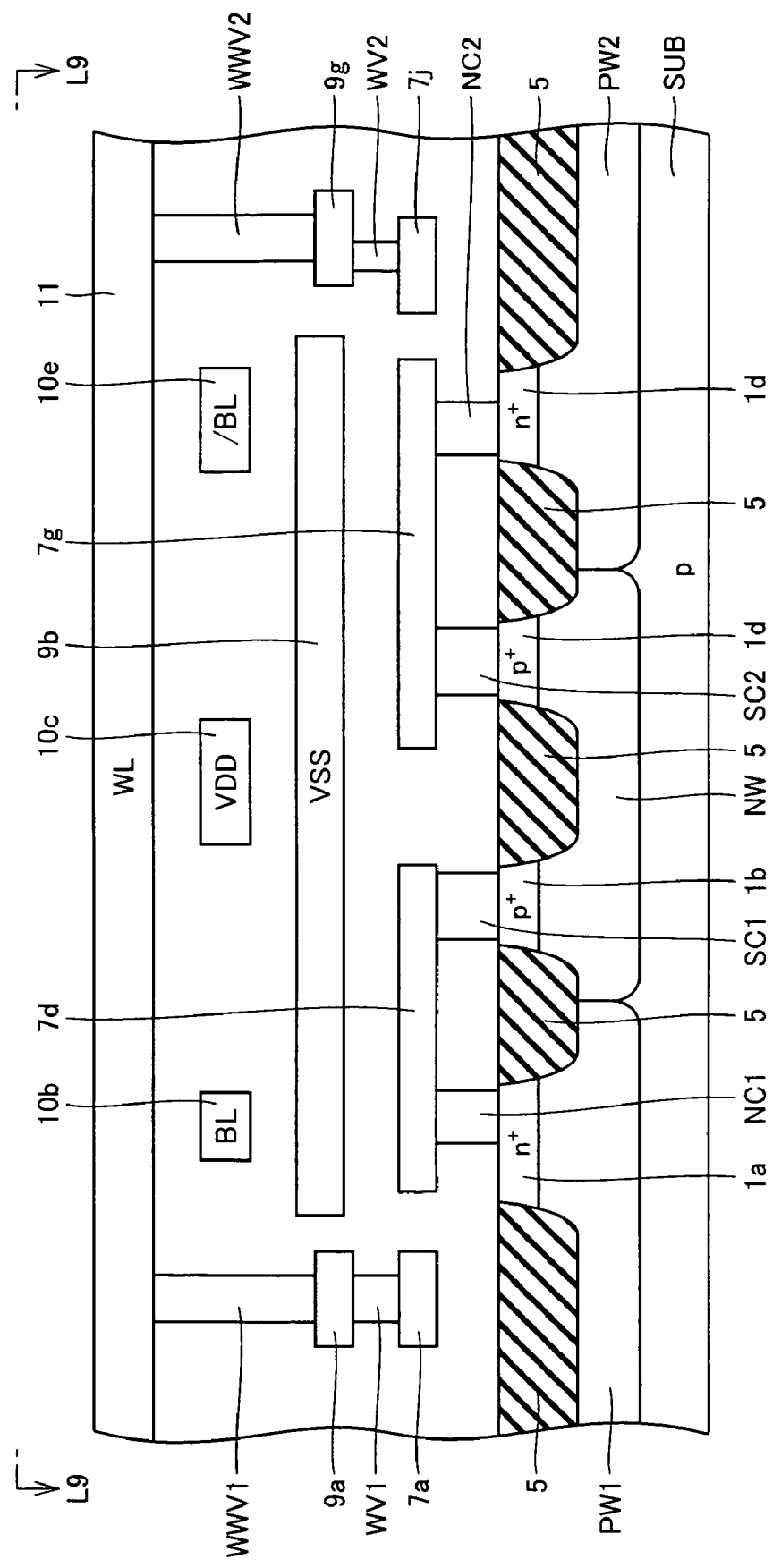
FIG. 9 is a diagram schematically showing a cross sectional structure along line L9-L9 of FIG. 7.

FIG. 9 is a diagram schematically showing a cross sectional structure along line L9-L9 of FIG. 7. In FIG. 9, P wells PW1 and PW2 are formed on the surface of P type semiconductor substrate SUB so that N well NW is located between these. N type active region (impurity region) 1a is formed on the surface of P well PW1, and P type active regions 1b and 1c are formed apart from each other on the surface of N well NW. N type active region 1d is formed on the surface of P well PW2. These active regions 1a to 1d are isolated from each other by means of element isolation film (region) 5.

After the formation of a not shown interlayer insulating film, first metal lines 7a, 7d, 7g and 7j are formed. First metal line 7d is electrically connected to active regions 1a and 1B via contact NC1 and shared contact SC1, respectively. First metal line 7g is electrically connected to active regions 1c and 1d via shared contact SC2 and contact NC2, respectively. First metal lines 7a and 7j are connected to polysilicon lines through portions that are not shown.

Second metal lines 9a and 9g are provided aligning with first metal lines 7a and 7j, and second metal line 9b is provided in a layer above first metal lines 7d and 7g, overlapping these lines in a plan view. Second metal line 9a is electrically connected to first metal line 7a via first via WV1, and second metal line 9g is electrically connected to first metal line 7j via first via WV2. Second metal line 9b is an interconnection line for connecting the VSS source nodes of memory cells, and is electrically isolated from first metal lines 7d and 7g in a lower layer.

Third metal lines 10b, 10c and 10e are provided apart from each other in a layer above second metal line 9b. Third metal lines 10b and 10e form a portion of bit line BL and /BL, respectively, and third metal line 10c supplies high side power supply voltage VDD.

Fourth metal line 11 is placed so as to continuously extend in a layer above these third metal lines 10b, 10c and 10e. This fourth metal line 11 forms a portion of word line WL and is electrically connected to second metal lines 9a and 9g via second vias WWV1 and WWV2, respectively.

As shown in this FIG. 9, also in the word line extending direction, interconnection line 9b for transmitting low side power supply voltage VSS is provided overlapping first metal lines 7d and 7g for connection with the internal nodes (storage nodes) in a plan view, and thus, interconnection lines for electrically connecting the low side source nodes of memory cells can be arranged without increasing the size of memory cells.

Figure 10:
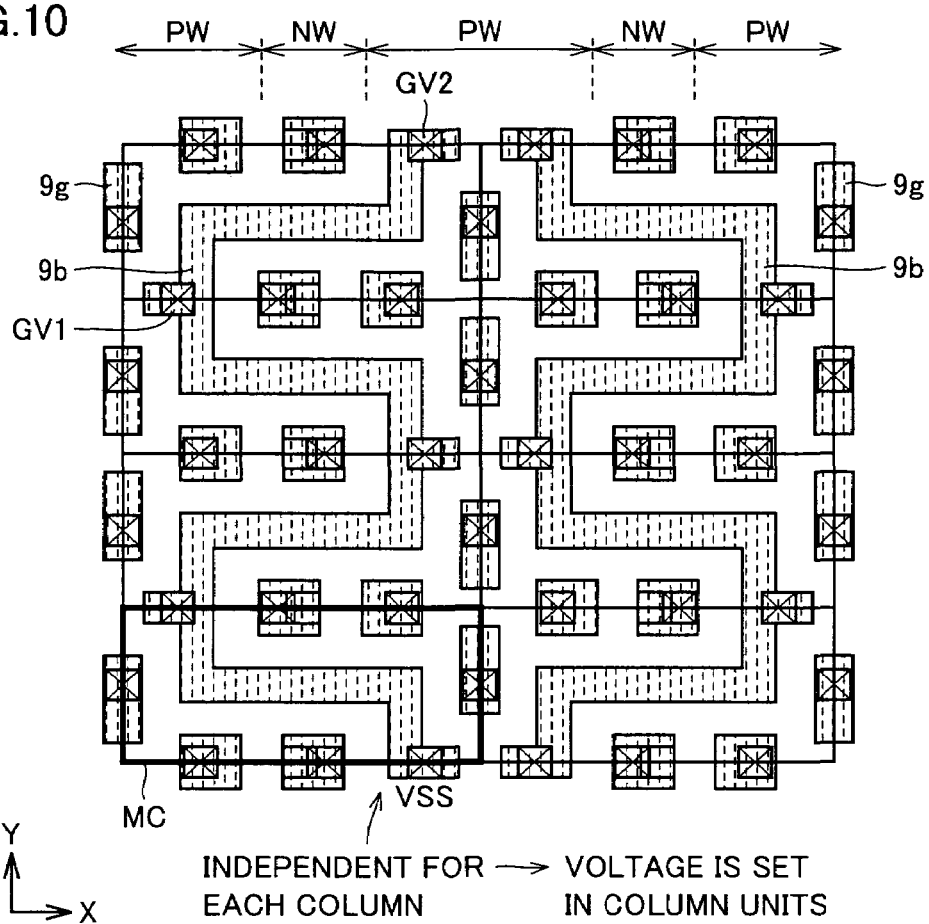
FIG. 10 is a diagram showing the layout of second metal lines in memory cells arranged in rows and columns in the semiconductor memory device according to the first embodiment of the present invention.

FIG. 10 is a diagram schematically showing the interconnection layout for memory cells disposed in four rows and two columns when the second metal lines are formed. In FIG. 10, in the boundary regions between memory cells MC adjacent in X direction, second metal lines 9g are provided being aligned in the directions of Y and X for making electrical contacts with the fourth metal lines which constitute word lines. Memory cells in columns adjacent in X direction share P well PW, while N well NW is shared only by memory cells which are aligned in Y direction.

In the memory cells, vias GV1 and GV2 constituting the VSS source nodes are connected with each other via second metal lines 9b. For memory cells MC adjacent in Y direction, the layout patterns which are mirror symmetrical with respect to the boundary regions are arranged repeatedly, and the VSS source lines are arranged in a zigzag form for each memory cell column, so that the voltage level of the low side power supply voltage VSS can be controlled for each column (memory cells aligned in Y direction). In other words, vias GV2 for the memory cells MCs adjacent in X directions are provided being isolated from each other, and second metal lines 9b in adjacent columns are isolated from each other, and accordingly, low side power supply voltage VSS can be adjusted for each memory cell column. In addition, the source nodes of respective driver transistors within a memory cell MC are short-circuited with each other, so that difference in potential between the source nodes of the driver transistors can be suppressed even in discharging of a bit line, so that the memory cell can be operated stably.

In addition, voltage VSS can be adjusted in memory cell column units, and the scheme for dynamically controlling the VSS source line voltage as shown in the previously described References 1 and 2 can be used, and thus, voltage VSS is set to the ground voltage level for the selected column, and voltage VSS is set to a voltage level higher than the ground voltage (for example, 0.4 V) for unselected columns, and thus, the current consumption at standby and in an operation can be reduced.

The configuration shown in the above described References 1 and 2 can be used as the configuration for adjusting source voltage VSS for the driver transistors for every memory cell column. Specifically, the voltage level of source voltage VSS for the driver transistors is set for the selected column on the basis of a column address signal. In this construction, an address transition detection signal (ATD), which is usually used in SRAM's, or a clock signal that defines the access cycle may be used as the signal for setting the voltage switching timing.

In addition, VSS source line 9b is arranged in a zigzag form along the direction of the memory cell columns (Y direction), and therefore, the interconnection length becomes large, as compared to a layout where the interconnection lines linearly extend in the memory cell column direction, and the rise of memory cell source voltage VSS (distribution) may possibly be large on VSS source line 9b, due to the increase in the interconnection resistance. VSS source lines 9b, however, are individually provided for each column, and when a word line is selected, a discharging current flows in from only one memory that is connected to the selected word line, and therefore, the amount of flowing in current is small, and the rise of the source potential is sufficiently small. In addition, the source nodes of the driver transistors in a memory cell are connected with each other and the potentials of the source nodes of the driver transistors are substantially equal to each other in each memory cell, and therefore, the data can be stably held in unselected memory cells, and data can be stably held in readout of data in the selected memory cell.

In addition, the VSS source lines are metal lines, and the resistance value thereof is sufficiently small, and the problem of potential distribution resulting from the interconnection resistance can be almost completely resolved. Specifically, when the sheet resistance of the second metal lines is approximately 200 mΩ/□, and the interconnection length of VSS source lines per memory cell of one bit is approximately 1 μm, taking bending (zigzag form) into consideration, the width of the interconnection line is 0.1 μm and the total number of rows is 512, interconnection resistance Rall of the entirety of the VSS source lines can be represented by the following expression, using the relation of 200 mΩ·L/W.

$$Rall = 200\ m \cdot 1\ \mu m \cdot 512 / 0.1\ \mu m \approx 1\ K\Omega$$

When high side power supply voltage VDD is 1.0 V and the cell current is 10 μA, the increase in low side power supply voltage VSS in a memory cell which is the farthest from the low side power supply node is 10 μA·1 KΩ=0.01 V, which is sufficiently small in comparison with high side power supply voltage VDD of 1.0 V. In addition, the interconnection resistance is 1Ω(=200 mΩ·1 μm/0.1 μm) within a memory cell, and the difference in voltage between the source nodes of the driver transistors is 1.0 μV (=1Ω·10 μA), and the effects on the voltage retention characteristics are negligible.

As described above, according to the first embodiment of the present invention, the source nodes of the driver transistor in a memory cell are connected to each other using a second metal line (metal line in a layer below the bit lines) which extends in a step form within the memory cell and in a zigzag form in the direction of the memory cell columns. The VSS source lines between adjacent columns are isolated from each other, and thus, low side power supply voltage VSS for memory cells can be set for each memory cell column.

In addition, in a memory cell MC, P wells are provided on both sides of an N well, an access transistor and a driver transistor are placed in each P well, load transistors are placed in the N well, the pitch of memory cells in Y direction is that for two transistors, and the size of the memory cell can be prevented from increasing in Y direction.

In addition, the power supply line for transmitting high side power supply voltage VDD and the power supply line for transmitting low side power supply voltage VSS are formed of lines in different interconnection layers, and power supply voltage VDD and VSS are not transmitted through interconnection lines in the same interconnection layer, and therefore, the interconnection pitch conditions in upper interconnection layers can be relaxed.

Second Embodiment

Figure 11:
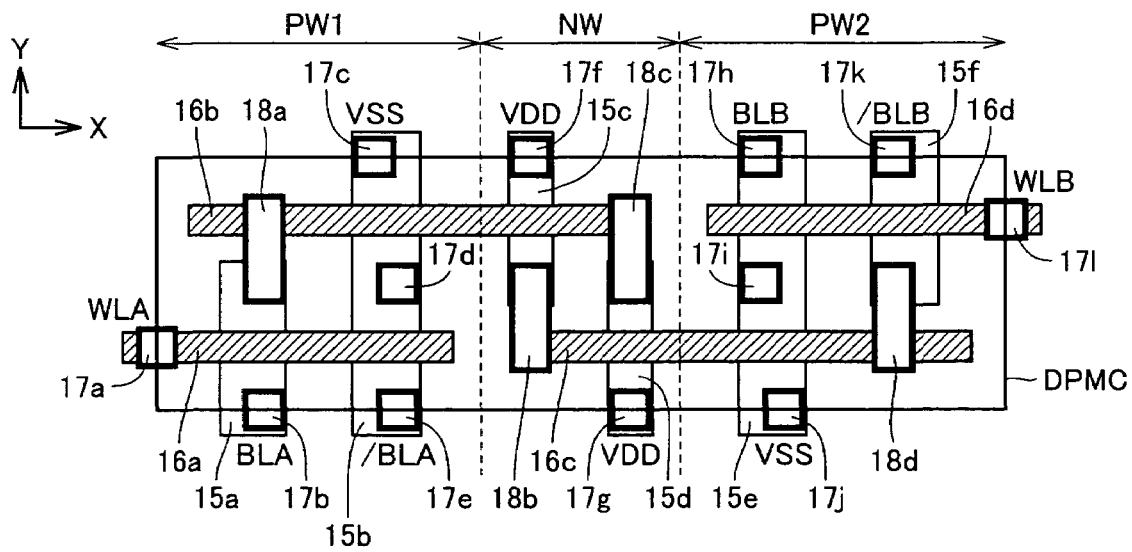
FIG. 11 is a diagram schematically showing the layout from the substrate to contacts in a memory cell according to the second embodiment of the present invention.

FIG. 11 is a diagram schematically showing the layout of memory cells in a semiconductor memory device according to the second embodiment of the present invention. FIG. 9 shows the layout of active regions of a dual port SRAM cell DPMC and first polysilicon lines.

In FIG. 11, dual port SRAM cell DPMC is formed in the region of an N well NW and P wells PW1 and PW2 which are arranged on both sides of the N well NW. In P well PW1, an active region 15a in a rectangular form is provided extending in Y direction within the memory cell forming region, and an active region 15b is formed extending in Y direction at a distance from active region 15a. Active region 15a extends over adjacent memory cells in Y direction, and active region 15b is provided continuously extending over memory cells aligned in one column in Y direction.

First polysilicon lines 16a and 16b are formed at a distance from each other and extending in X direction to cross active regions 15a and 15b. First polysilicon line 16a extends into a P well region of an adjacent memory cell, not shown, while first polysilicon line 16b extends from P well PW1 to N well NW.

A source line contact 17a is provided to first polysilicon line 16a. A contact 17b is formed at one end portion of active region 15a, and a shared contact 18a is provided in the other end region of active region 15a. This shared contact 18a makes electrical connection between first polysilicon line 16b and active region 15a.

Contacts 17c and 17d are provided in active region 15b so as to sandwich first polysilicon line 16a, and a contact 17c is provided on the side opposite to contact 17d with respect to first polysilicon line 16b. Contact 17c is a contact for the connection to the VSS source line. Contacts 17b and 17e formed in active regions 15a and 15b are contacts for connection to A port bit lines BLA and /BLA, respectively.

Active regions 15c and 15d in a rectangular form are formed at a distance from each other in N well NW, extending and being displaced in Y direction. First polysilicon line 16b extends crossing active region 15c in X direction, and first polysilicon line 16c is provided extending in X direction and crossing active region 15d. First polysilicon line 16b is electrically connected to active region 15d via shared contact 18c, and first polysilicon line 16c is connected to active region 15c via shared contact 18b.

A contact 17f is formed in the end portion of active region 15c opposite to shared contact 18b with respect to first polysilicon line 16b, and a contact 17j is formed in the end portion of active region 15b opposite to shared contact 18c. Contacts 17f and 17g are contacts for connection to the VDD source lines for transferring high side power supply voltage VDD.

In P well PW2, active regions 15e and 15f are formed extending in Y direction at a distance from each other. First polysilicon line 16c is provided continuously extending in X direction from N well NW and crossing active region 15e. In addition, first polysilicon line 16d is formed extending in X direction and crossing active regions 15e and 15f. In active region 15e, contacts 17h and 17j are respectively formed in opposite end portions, and a contact 17i is formed in the middle region. Contact 17h is a contact for the connection to a B port bit line BLB, and contact 17g is a contact for the connection to a VSS source line. Active region 15f has a region on one side connected to first polysilicon line 16c via shared contact 18d, and has a contact 17k formed in the region on the other side thereof. Contact 17k is a contact for the connection to a B port bit line /BLB.

A contact 17l for the connection to a B port word line WLB is formed in first polysilicon line 16d in the memory cell boundary region. Contact 17l is shared with a not shown memory cell adjacent in X direction (first polysilicon line 16d extends into the P well region for the memory cells in an adjacent column).

In the interconnection layout shown in this FIG. 11, active regions and interconnection lines of memory cells are arranged in mirror symmetry in the directions of X and Y. Accordingly, active regions 15b and 15e are formed continuously extending in Y direction.

Figures 12, 13, 14:
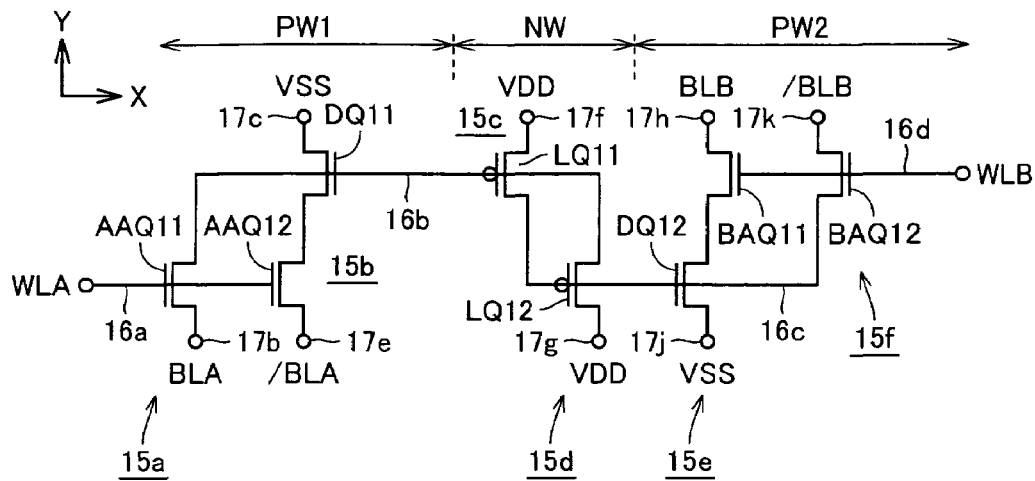
FIG. 12 is a diagram showing the electrical connection of transistors in the interconnection layout shown in FIG. 11.
FIG. 13 is a diagram schematically showing the layout of first metal lines in a layer above the interconnection layout shown in FIG. 11.
FIG. 14 is a diagram showing the electrical connection of transistors in the interconnection layout shown in FIG. 13.

FIG. 12 is an electrical equivalent circuit diagram showing the connection of memory cell transistors in the interconnection layout shown in FIG. 11. In FIG. 10, a driver transistor DQ11 and an access transistor AAQ12 are formed within an active region 15b in a P well PW1, and an access transistor AAQ11 is formed in an active region 15a. These transistors DQ11, AAQ11 and AAQ12 are formed of an N channel MOS transistor. One conduction node of MOS transistor DQ11 is connected to contact 17c, and one conduction node of access transistor AAQ12 is coupled to contact 17e. One conduction node of access transistor AAQ11 is connected to contact 17b. These contacts 17b and 17e are finally connected to A port bit lines BLA and /BLA, respectively. Contact 18c is finally connected to a VSS source line. The gates of access transistors AAQ11 and AAQ12 are both connected to a first polysilicon line 16a. First polysilicon line 16a is finally connected to an A port word line WLA.

Load transistors LQ11 and LQ12 constituted by a p channel MOS transistor are provided in active regions 15c and 15d, respectively, in an N well NW. The gate of load transistor LQ11 is formed of a first polysilicon line 16b commonly to the gate of driver transistor DQ11, and first polysilicon line 16*b* is further connected to the other conduction node of access transistor AAQ11.

In P well PW2, a driver transistor DQ12 and an access transistor BAQ11 are formed being connected in series in an active region 15*e*, and an access transistor BAQ12 is formed in an active region 15*f*. The gates of transistors LQ12 and DQ12 are both connected to a first polysilicon line 16*c*, and this first polysilicon line 16*c* is connected to one conduction node of transistor LQ11 and to one conduction node of transistor BAQ12. The gates of access transistors BAQ11 and BAQ12 are connected to each other via a first polysilicon line 16*d*. First polysilicon line 16*d* is ultimately connected to a B port word line WLB. Access transistors BAQ11 and BAQ12 are ultimately connected to B port bit lines BLB and /BLB via contacts 17*h* and 17*k*, respectively.

As shown in FIG. 12, load transistors LQ11 and LQ12 for both A port and B port are formed in N well NW and in each of P wells PW1 and PW2 which are placed on both sides of N well NW, driver transistor is placed apart from other driver transistor, and A port access transistors and B port access transistors are both provided, respectively. As is clear from the electrical equivalent circuit shown in this FIG. 12, memory cells have a pitch of two transistors connected in series in Y direction, and thus, increase in the size of the memory cells in Y direction can be suppressed to implement a dual port memory cell, as in the first embodiment.

FIG. 13 is a diagram schematically showing the layout of first metal lines in a layer above the interconnection layout shown in FIG. 11 and the arrangement of vias for the connection of metal lines in an upper layer to first metal lines. FIG. 11 shows both contacts 17*a* to 17*l* and shared contacts 18*a* to 18*d* shown in FIG. 9.

First metal lines 20*a* to 20*l* are provided corresponding to contacts 17*a* to 17*l*, respectively. Furthermore, a via 22*a* is provided to first metal line 20*a*, and a via 22*b* is formed for first metal line 20*b*, having a portion overlapping with contact 17*b*, and a via 22*c* is formed for first metal line 20*c*, overlapping with contact 17*c* in a plan view.

A via 22*d* is formed for first metal line 20*f*, having a portion overlapping with contact 17*e*. A via 22*f* is formed for first metal line 20*d*, overlapping with contact 17*f*. A via 22*e* is formed for first metal line 20*g*, overlapping with contact 17*g*. Vias 22*h* and 22*k* are formed for first metal lines 20*h* and 20*k*, having portions overlapping contacts 17*h* and 17*k*, respectively. A via 22*g* is formed for first metal line 20*j*, overlapping with contact 17*j*. A via 22*i* is formed for first metal line 20L, being at a distance from contact 17L. Vias 22*a* and 22*i* are vias for the connection to word lines WLA and WLB, respectively, and are arranged being displaced in Y direction.

FIG. 14 is an electrical equivalent circuit diagram showing the connection of transistors in a memory cell after the completion of the interconnection layout shown in FIG. 13. As shown in FIG. 14, contact 17*d* and shared contact 18*b* are connected through first metal line 20*e*, and shared contact 18*c* and contact 17*i* are connected through first metal line 20*i*. As a result, the gates of load transistor LQ11 and driver transistor DQ11 are connected to a connection node (contact 17*i*) between access transistor BAQ11 and driver transistor DQ12. In addition, the gates of load transistor LQ12 and driver transistor DQ11 are connected to a connection node (contact 17*d*) between driver transistor DQ11 and access transistor AAQ12. Storage nodes which are formed of first metal lines 20*i* and 20*e* are coupled to A port bit lines BLA and /BLA, respectively, when access transistors AAQ1 and AAQ12 are made conductive. In addition, storage nodes to which first metal lines 20*i* and 20*e* are coupled respectively are coupled to B port bit lines BLB and /BLB, respectively when access transistors BAQ11 and BAQ12 are selected (when B port word line WLB is selected).

Figure 15:
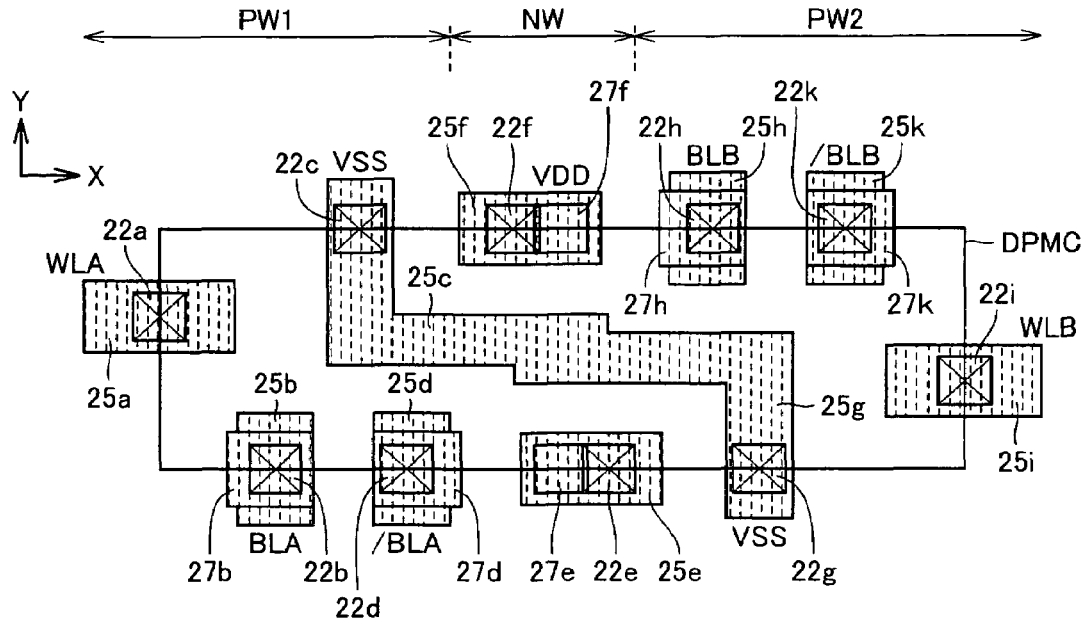
FIG. 15 is a diagram schematically showing the layout of second metal lines in a layer above the interconnection layout shown in FIG. 13.

FIG. 15 is a diagram showing the layout of second metal lines in a layer above the interconnection layout shown in FIG. 13. In FIG. 15, second metal lines 25*a*, 25*b*, 25*d*, 25*e*, 25*f*, 25*h*, 25*k* and 25*i* are provided to contacts 22*a*, 22*b*, 22*d*, 22*e*, 22*f*, 22*h*, 22*k* and 22*i*, respectively, in dual port SRAM cell DPMC.

VSS source contacts 22*c* and 22*g* are connected to each other through second metal lines 25*c* and 25*g* which are in an L shaped form and are connected to each other. Although in FIG. 13, second metal lines 25*c* and 25*g* are formed overlapping only partially, these interconnection lines are in the same interconnection layer and extend continuously.

Vias 27*b* and 27*d* for the connection to bit lines in an upper layer are further provided for second metal lines 25*b* and 25*d*, respectively, and vias 27*f* and 27*e* which are aligned in X direction are arranged for metal lines 25*f* and 25*e*, respectively. These vias 27*f* and 27*e* are also provided for the connection to VDD source lines (high side power supply lines) in an upper layer. Vias 27*h* and 27*k* for the connection to bit lines in an upper layer are provided for second metal lines 25*h* and 25*k*, respectively.

In the layout of the memory cell shown in FIG. 15, the source nodes (contacts 22*c* and 22*e*) of the driver transistors are connected to each other through second metal lines 25*c* and 25*g*. These second metal lines 25*c* and 25*g* extend simply linearly in the directions of Y and X, and as in the configuration of the previously described single port SRAM cell, the VSS source nodes of the memory cell are interconnected over the shortest distance. These second metal lines 25*c* and 25*g* are isolated from those in the memory cells that are adjacent in X direction. Accordingly, in this construction also, the potential of the VSS nodes can be set individually for each memory cell column.

Figure 16:
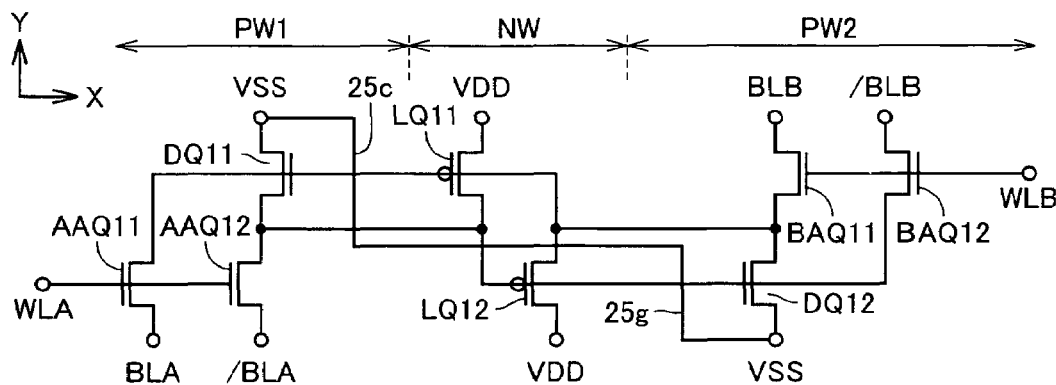
FIG. 16 is a diagram showing the electrical connection of transistors in the interconnection layout shown in FIG. 15.

FIG. 16 is an electrical equivalent circuit diagram showing the connection of transistors within dual port SRAM cell DPMC after the completion of the interconnection layout shown in FIG. 15. As shown in FIG. 16, the source nodes of driver transistors DQ11 and DQ12 are connected to each other through second metal lines 25*c* and 25*g* within the memory cell. Second metal lines 25*c* and 25*g* extend only within the memory cell and are each formed extending linearly into an L shaped form in the interconnection layout, and thus, the interconnection lengths thereof are short.

Now, a state where an A port word line WLA is selected is considered. In this case, one of driver transistors DQ11 and DQ12 is in the ON state and the other is in the OFF state in accordance with the data stored in the memory cell. A column current flows through bit lines BLA and /BLA upon readout of data, and a current flows through the source node (VSS supplying node) via driver transistor DQ11 or DQ12 in the ON state. When driver transistor DQ11 is in the ON state and driver transistors DQ12 is in the OFF state, for example, a column current flows from A port bit line /BLA to the source node (VSS supplying node) via access transistor AAQ12 and driver transistor DQ11. Driver transistor DQ12 is in the OFF state, and therefore, although the column current is supplied from bit line BLA via access transistor AAQ11, it is not transferred to the VSS source node.

However, the source nodes of driver transistors DQ11 and DQ12 are short-circuited through second metal lines 25*c* and 25*g*, and the source node potentials of driver transistors DQ11 and DQ12 are at the same voltage level, even when they rise due to the column current from A port bit line /BLA, and there is almost no difference in the source node potential. The threshold voltages of MOS transistors become varied even within one memory cell, with transistor miniaturization. Even in a memory cell having large variation in the threshold voltage, destructive readout in which the stored data is inverted may occur, due to increase in the source potential of the driver transistor in some cases, and the margin for the stability of the readout operation of the memory cell becomes smaller. In such case where there is variation in the threshold voltage within a memory cell, however, there is no difference in the source node potentials of the driver transistors within the memory cell, and the gate to source voltages of driver transistors DQ11 and DQ12 change in the same direction, and therefore, the latching ability for the storage nodes in the inverter latch of the memory cell remains in a balanced state and the problem of destructive readout in which the stored data is inverted can be resolved reliably.

The advantage of short-circuiting the source nodes of the driver transistors within this memory cell holds for the single port SRAM cell according to the previously described first embodiment.

Figure 17:
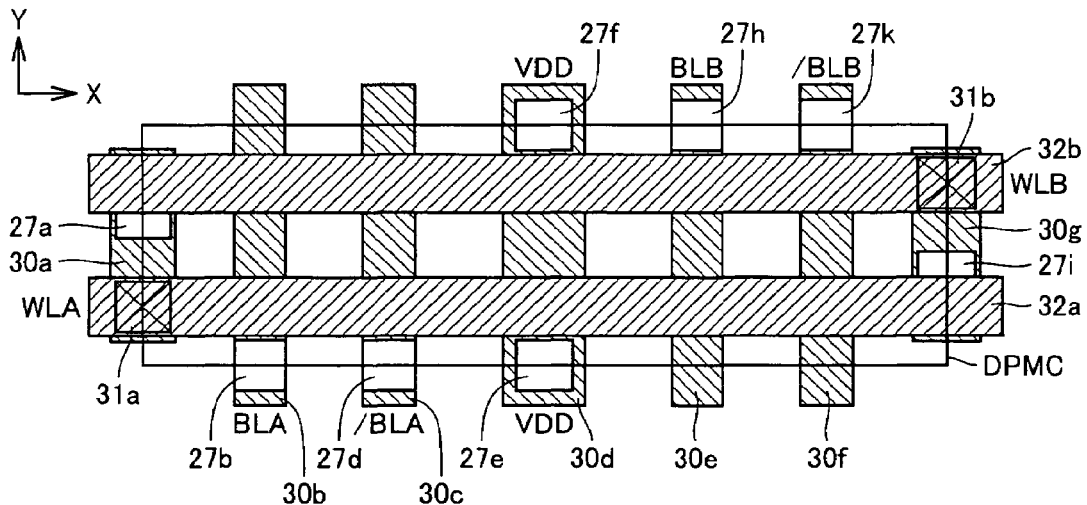
FIG. 17 is a diagram showing the layout of third and fourth metal lines in layers above the interconnection layout shown in FIG. 15.

FIG. 17 is a diagram showing the layout of third and fourth metal lines in a layer above the interconnection layout shown in FIG. 15. In FIG. 15, third metal lines 30a and 30g in a rectangular form are formed extending in Y direction within the memory cell region in the memory cell boundary region. In addition, third metal lines 30b to 30f are provided for memory cells in one column, continuously extending in Y direction at a distance from each other.

Third metal line 30a is coupled to first metal line 25a shown in FIG. 13 through a via 27a. Metal lines 30b and 30c are connected respectively to second metal lines 25b and 25d through vias 27b and 27d shown in FIG. 13. These third metal lines 30b and 30c form A port bit lines BLA and /BLA, continuously extend in Y direction and are coupled to memory cells which are aligned in X direction the columns. Third metal line 30d is coupled to second metal lines 25f and 25e shown in FIG. 13 through vias 27f and 27e. Third metal line 30d constitutes a VDD source line and transfers high side power supply voltage VDD.

Third metal lines 30e and 30f are connected to second metal lines 25h and 25k shown in FIG. 13 through vias 27h and 27k, respectively. These third metal lines 30e and 30f constitute B port bit lines BLB and /BLB, and continuously extend in Y direction being shared by memory cells aligned in Y direction.

Third metal line 30g is connected to second metal line 25i shown in FIG. 15 through a via 27i.

Fourth metal lines 32a and 32b are provided extending in X direction so as to cross these third metal lines 30a to 30g. Fourth metal line 32a is connected to third metal line 30a through a via 31a, and fourth metal line 32b is connected to third metal line 30g through a via 31b. These fourth metal lines 32a and 32b constitute A port word line WLA and B port word line WLB, respectively, and continuously extend linearly in X direction so as to be coupled to the memory cells aligned in the row direction.

As shown in FIG. 17, third metal lines 30a to 30g do not include a VSS source line. VSS source lines are constituted of second metal lines in a lower layer, and thereby, a sufficient interconnection line pitch can be secured for the third metal lines without increasing the cell size in X direction also in the dual port memory cell structure.

Figure 18:
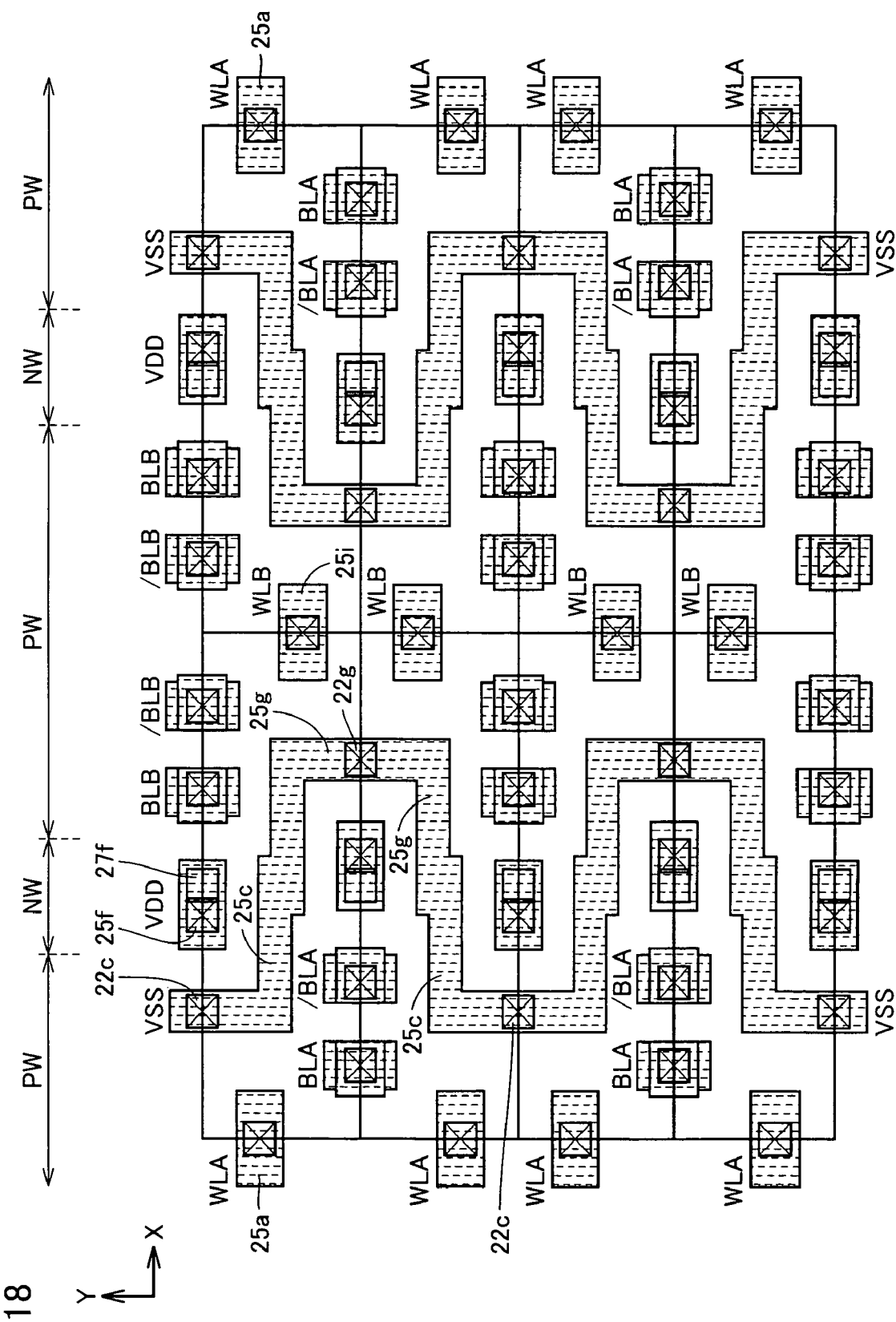
FIG. 18 is a diagram showing the interconnection layout of VSS source lines for a plurality of memory cells according to the second embodiment of the present invention.

FIG. 18 is a diagram schematically showing the interconnection layout after the formation of the second metal lines according to the second embodiment of the present invention. FIG. 18 shows an interconnection layout of dual port memory cells DPMC arranged in four rows and two columns.

As shown in FIG. 18, dual port memory cells DPMC are formed having a mirror symmetrical interconnection layout in the directions of X and Y. Second metal line 25f for supplying high side power supply voltage VDD to N well NW is provided in the memory cell boundary region in the Y direction, being shared by memory cells adjacent in Y direction, and vias 27f are formed for VDD supplying second metal lines 25f, being aligned in Y direction.

Second metal lines 25a and 25i for the connection to word lines in the center region of P wells PW on both sides of N well NW are placed opposing in x direction in each memory cell BPMC. In FIG. 18, second metal line 25i for the connection to a B port word line is placed within P well PW at the middle, and second metal lines 25a for the connection to an A port word line are provided within P wells PW on opposite sides. These second metal lines 25a and 25i are shared by memory cells which are adjacent in X direction.

Similarly, a pair of A port bit lines BLA and /BLA, as well as a pair of B port bit lines BLB and /BLB are arranged at the portions mirror symmetrical in X direction for each memory cell in accordance with the mirror symmetrical layout of memory cells. In FIG. 18, B port bit lines BLB and /BLB for different columns are provided in the vicinity of and on opposite sides of second metal line 25i for the B port word line placed at the center of the figure, and second metal lines for the connection to A port bit lines BLA and /BLA are provided close to second metal line 25a for the connection to an A port word line.

Second wires 25c and 25h for supplying VSS are continuously formed crossing N well NW in each dual port memory cell DPMC. The memory cell layout is mirror symmetrical in Y direction, and second metal lines 25c and 25g for supplying VSS are provided in mirror symmetry in Y direction and are formed crossing N well NW within each dual port memory cell and into a zigzag form in Y direction. Contacts 22c and 22g for the VSS supplying second metal lines 25c and 25g are only shared memory cells adjacent in Y direction, and are not shared by memory cells adjacent in X direction. Accordingly, the potential of VSS source lines 25c and 25h can be adjusted in units of columns in this dual port memory cell DPMC.

In the case of the dual port memory cell structure, it may occur that a doubled amount of cell current of a single port memory cell at the most flows through a VSS source line. Even in this case, with the application of the same conditions of the cell current, cell power supply voltage and the VSS source line as in the first embodiment, the memory cell source potential increases by 0.02 V and is sufficiently small in comparison with cell power supply voltage VDD which is 1.0 V, so that data can be read out stably and held stably in unselected memory cells.

As described above, according to the second embodiment of the present invention, in a dual port SRAM cell, the driver source nodes are arranged to be short-circuited within each memory cell and VSS source lines are provided crossing N well in which the load transistors are formed. Thus, the potential of VSS source lines can be adjusted in units of memory cells aligned in the column direction, as in the first embodiment, so that the current dissipation and the power consumption can be reduced.

In addition, the driver transistor source nodes are short-circuited within each memory cell, and therefore, the potential of the source nodes of these driver transistors can be made substantially the same, as in the case of a single port memory cell. In addition, the direction of change in gate to source voltage of the driver transistors can be made the same, even in the case where there is variation in the threshold voltage, and thus, a static noise margin can be secured and readout of inversed data can be prevented.

Further, in the dual port memory cell structure, VSS source lines are formed by the interconnection lines in a layer lower than the high side power supply lines and the bit lines, so that a sufficient pitch can be secured for the third metal lines, and thus, dual port memory cells with which the VSS source line voltage can be controlled in column units can be provided without increasing the size of memory cells.

Third Embodiment

Figure 19:
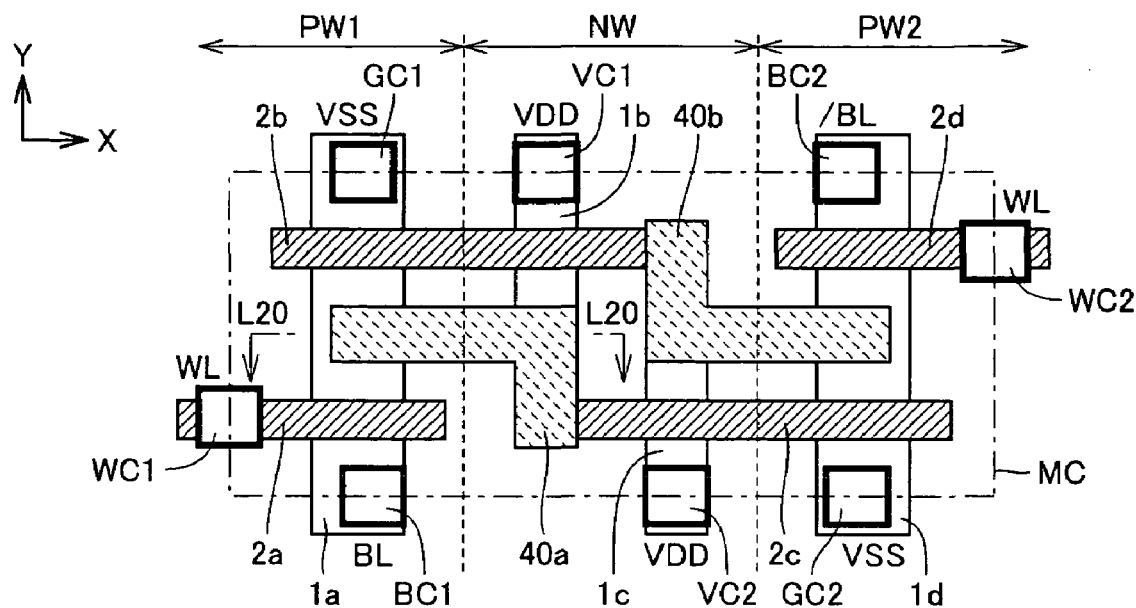
FIG. 19 is a diagram schematically showing the interconnection layout from the substrate to contacts of a memory cell according to the third embodiment of the present invention.

FIG. 19 is a diagram schematically showing the interconnection layout of a memory cell according to the third embodiment of the present invention. FIG. 19 shows the layout of contacts for active regions and of polysilicon lines. The layout of the memory cell shown in this FIG. 19 is essentially different from the interconnection layout of the memory cell shown in FIG. 1, in the following points. Specifically, local interconnecting line (LIC) 40a and 40b are provided in place of shared contacts SC1 and SC2 shown in FIG. 1. Local interconnecting line 40a electrically connects the active region 1a that is formed in P well PW1 and the active region 1b that is formed in N well NW, and is further connected to polysilicon line 2c which extends in X direction so as to cross active regions 1c and 1d. Local interconnecting line 40a has a function of both a contact and an interconnection line, and extends in X direction so as to electrically connect active regions 1a and 1b, and extends in Y direction so as to electrically connect active region 1b to first polysilicon line 2c. Thus, the internal line interconnection for the storage nodes in the memory cell is made.

Local interconnecting line (LIC) 40b has a region that extends in Y direction and a region that extends in X direction, so that the portion extending in Y direction electrically connects first polysilicon line 2b to active region 1c and the portion extending in X direction electrically connects active regions 1c and 1d. Other portions of the arrangement in the interconnection layout of the memory cell shown in FIG. 16 are the same as those in the layout of the memory cell shown in FIG. 1, and the same reference numerals are attached to corresponding portions, and detailed descriptions thereof are not repeated.

Contacts and interconnection lines can be implemented using one interconnection layer by using local interconnecting line 40a and 40b, and thereby, the number of layers for metal lines for the internal node connection can be reduced.

Figure 20:
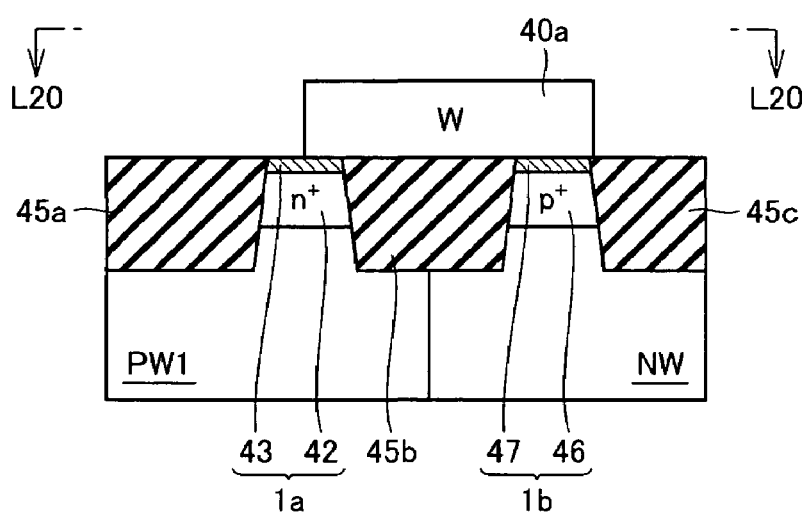
FIG. 20 is a diagram schematically showing a cross sectional structure of the local interconnecting lines shown in FIG. 19.

FIG. 20 is a diagram schematically showing a cross sectional structure of the portion of local interconnecting line 40a extending in Y direction along line L20-L20 shown in FIG. 19. In FIG. 20, an N type high concentration impurity region 42 is formed on the surface of P well PW1. A silicide film 43 is formed on the surface of high concentration impurity region 42. Impurity region 42 and silicide film 43 correspond to active region 1a shown in FIG. 19.

A high concentration p type impurity region 46 is formed on the surface of N well NW. A silicide film 47 is formed of, for example, cobalt silicide ($CoSi_2$), on the surface of impurity region 46. Impurity region 46 and silicide film 47 correspond to active region 1b shown in FIG. 19.

A field insulating film 45b for element isolation is formed between active regions 1a and 1b. In addition, field insulating films 45a and 45c for element isolation are formed around the outer periphery of active regions 1a and 1b, respectively.

Local interconnecting line 40a is formed electrically connecting impurity regions 42 and 44 which in turn are formed in active regions 1a and 1b across field insulating film 45b, and is constituted by a metal line formed of, for example, a high melting point metal (refractory metal), such as tungsten W.

Local interconnecting line 40a continuously extends in X direction, as shown in FIG. 19, over element isolation film 45b having the surface flattened by means of, for example, CMP (chemical mechanical polishing), and electrically connects impurity regions 42 and 46 in active regions 1a and 1b. Thus, no separate metal interconnection layer for the connection of these active regions is necessary, and thus, the number of interconnection layers can be reduced, as compared with a configuration in which impurity regions 42 and 46 are connected via contacts and a metal line in an upper layer. The portion where local interconnecting line 40a is connected to polysilicon line 2c that constitutes a word line has the same structure in a cross section as the previously described shared contact (SC1) shown in FIG. 2. Specifically, local interconnecting line 40a continuously extends in the directions of Y and X so as to have an L shaped form, and thus, is used as a contact and an interconnection line.

Figure 21:
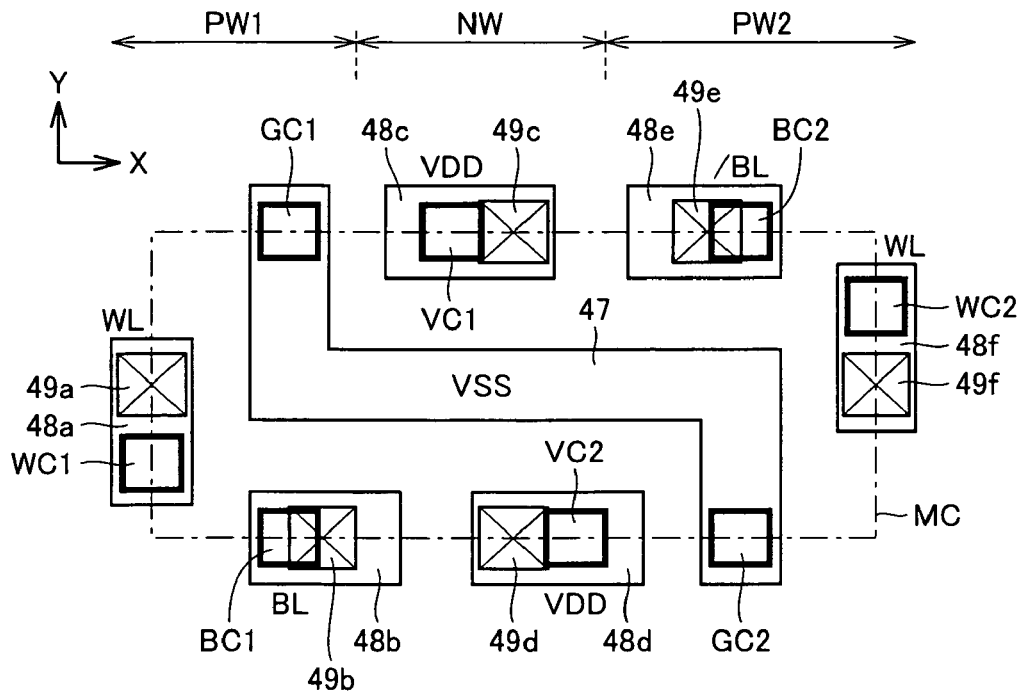
FIG. 21 is a diagram schematically showing the layout of first metal lines and vias in a layer above the interconnection layout shown in FIG. 19.

FIG. 21 is a diagram schematically showing the layout of first metal lines which are formed in a layer above the interconnection layout of the memory cell shown in FIG. 19 together with corresponding well regions NW, PW1 and PW2. In FIG. 21, first metal lines 48a, 48b, 48c, 48d, 48e and 48f are provided corresponding to contacts WC1, BC1, VC1, VC2, BC2 and WC2, respectively, which in turn are provided in the boundary region between memory cells MC. These lines are for the connection to metal lines in an upper layer, are formed into a rectangular shape shorter than the pitch of memory cells MC so as to be shared only by the adjacent memory cell on the other side of the boundary. Vias 49a to 49f for the connection to metal lines in an upper layer are provided corresponding to these first metal lines 48a to 48f, respectively. Vias 49c and 49d are placed being aligned in Y direction, and vias 49a and 49f are placed being aligned in X direction. Vias 49b and 49e are placed point symmetrically with respect to the center portion of the memory cell.

Contacts GC1 and GC2 for the connection of the source nodes of the driver transistors are connected to each other through first metal line 47. This first metal line 47 is formed linearly into a step form, as in the previously described first embodiment, and is provided above local interconnecting lines 40a and 40b shown in FIG. 19.

Figure 22:
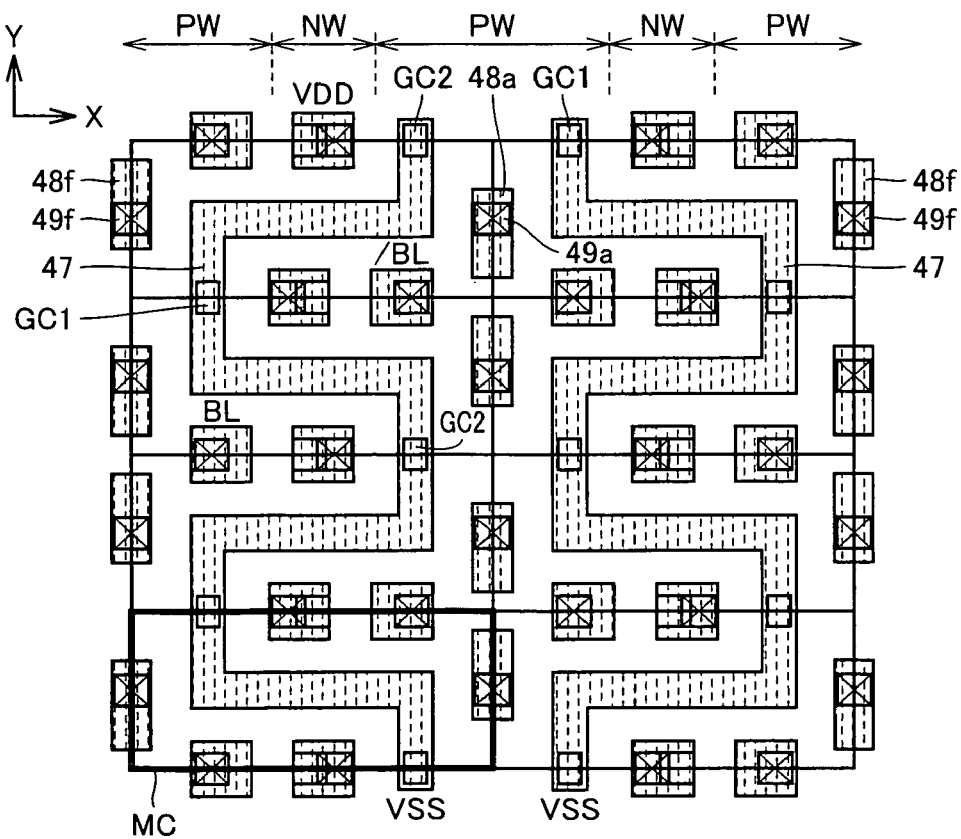
FIG. 22 is a diagram schematically showing the layout of VSS source lines for a plurality of memory cells in the interconnection layout shown in FIG. 21.

FIG. 22 is a diagram showing the interconnection layout in the case where the interconnection layout shown in FIG. 21 is applied to a plurality of memory cells. FIG. 22 shows a representative interconnection layout for memory cells MC which are aligned in four rows and two columns. In FIG. 22, P wells PW are formed being shared by memory cells arranged adjacent in X direction. N wells NW are provided between P wells PW. First metal lines (48c) for supplying high side power supply voltage VDD are disposed, in the regions that correspond to N wells NW, being shared by memory cells arranged adjacent in Y direction, and first metal lines 48a and 48f for the connection to word lines are provided being shared by memory cells arranged adjacent in X direction. These first metal lines 48a and 48f are alternately provided in X direction.

First metal lines 47 for constituting VSS source lines within memory cells MC are formed in a step form between contacts GC2 and GC1 which in turn are placed in the memory cell boundary regions, and are placed in such a layout that first metal lines 47 in memory cells adjacent in Y direction are laid out in mirror symmetry. Contacts GC1 and GC2 are alternately placed in Y direction in the memory cell boundary, and are alternately placed in X direction.

As shown in FIG. 22, first metal lines 47 which constitute VSS source lines are provided in such a winding form that first metal lines (48c) for supplying power supply voltage VDD and first metal lines (48b and 48e) for the connection to bit lines are sandwiched between first metal lines 47. According to the third embodiment also, contacts GC1 and GC2 are not shared by memory cells that are adjacent in X direction, and first metal lines 47 which constitute VSS source lines are continuously formed in a zigzag form in Y direction in column units, so that low side power supply voltage VSS can be set for each column.

Figure 23:
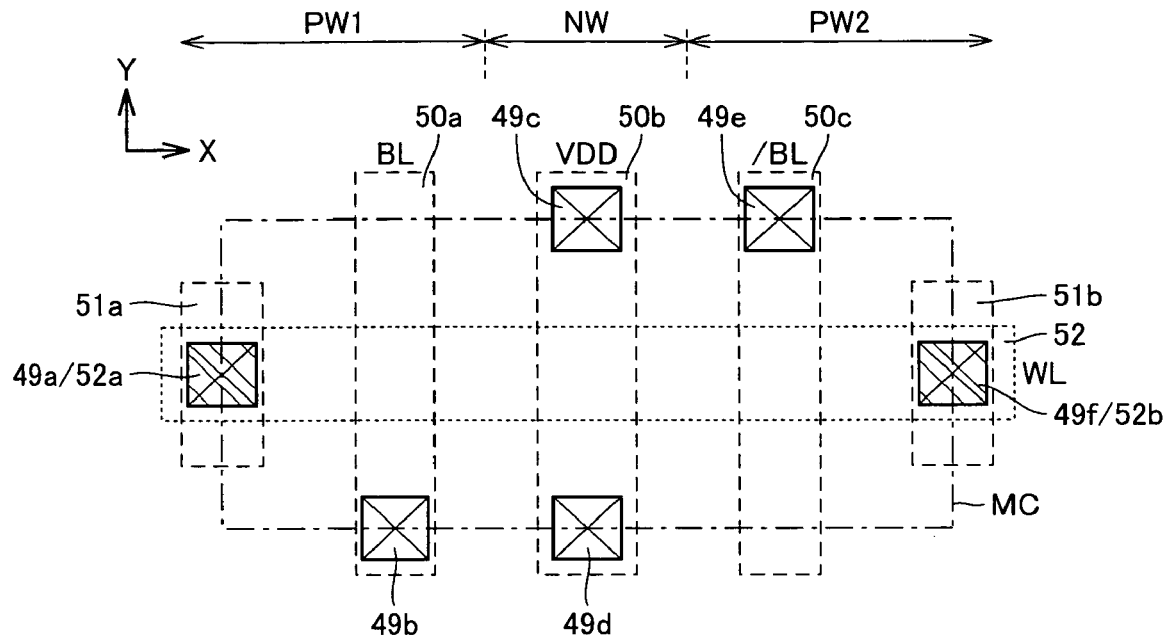
FIG. 23 is a diagram schematically showing the layout of second and third metal lines in layers above the interconnection layout shown in FIG. 21.

FIG. 23 is a diagram schematically showing the layout of second and third metal lines in layers above the interconnection layout shown in FIG. 21. FIG. 23 also shows vias 49a to 49f, as well as well regions NW, PW1 and PW2 in the lower layer shown in FIG. 21.

In FIG. 23, third metal lines 50a and 50c are provided corresponding to vias 49b and 49e, respectively, and third metal line 50b is provided corresponding to vias 49c and 49d. These third metal lines 50a to 50c continuously extend in Y direction, to constitute a bit line BL, a VDD source line and a bit line /BL, respectively.

In addition, second metal lines 51a and 51d are formed corresponding to vias 49a and 49f which in turn correspond to first metal lines 48a and 48f shown in FIG. 21, respectively. These second metal lines 51a and 51b function as intermediate line for the connection to word lines (WL) which are finally formed in an upper layer of memory cell MC, and are provided only within memory cells MC in Y direction.

Second metal lines 51a and 51b are connected to third metal line 52 continuously extending in X direction via second vias 52a and 52b, respectively. Third metal line 52 constitutes a word line WL. Here, vias 49a and 49f are formed overlapping with vias 52a and 52b, respectively.

Accordingly, local interconnecting lines are used for making connections for the internal nodes (storage nodes), and thereby, only the first to third metal line layers are required as interconnection layers for arranging the metal lines, and the number of layers for metal lines is reduced by one in comparison with the first embodiment. The number of required metal line layers is reduced, and thereby, the manufacturing cost can be reduced. In addition, the number of manufacturing steps is reduced, and accordingly, the probability of defects occurrence is reduced, and thus, the yield is improved.

Furthermore, in embedded SRAMs that are used in a system LSIs, such as systems on chips, the number of interconnection layers that can be effectively utilized in the SRAM cell increases by one, and therefore, the freedom of the interconnection increases (the fourth metal line layer can be used for the arrangement of any other interconnection lines).

Here, the interconnection layout shown in the third embodiment can be applied to a dual port SRAM cell similarly. Such a layout is used that bit lines BL and /BL are replaced with a pair of A port bit lines and a pair of B port bit lines, respectively, and each access transistor is arranged for a pair of A port access transistors and for a pair of B port transistors. In addition, word lines WL are separately provided for A port word lines WLA and B port word lines WLB. In other words, the interconnection layout in the case of a dual port SRAM cell can be implemented by replacing shared contacts (shared contact 18b and 18c in FIG. 11) which are formed for the load transistors in the N well in the interconnection layout of the second embodiment with local interconnecting lines.

As described above, according to the third embodiment of the present invention, local interconnecting lines formed on the element isolation film are used as interconnection lines for the connection of the internal storage nodes, and thereby, the required number of layers for the metal lines can be reduced, and thus, the number of manufacturing steps and the manufacturing cost can be reduced. In addition, the number of available metal line layers increases, and thereby, the freedom in design of the interconnection is increased.

In addition, the voltage level of memory cell source voltage VSS can be set in memory cell column units, as in the first embodiment, and the same effects as in the first embodiment can also be provided.

Fourth Embodiment

Figure 24:
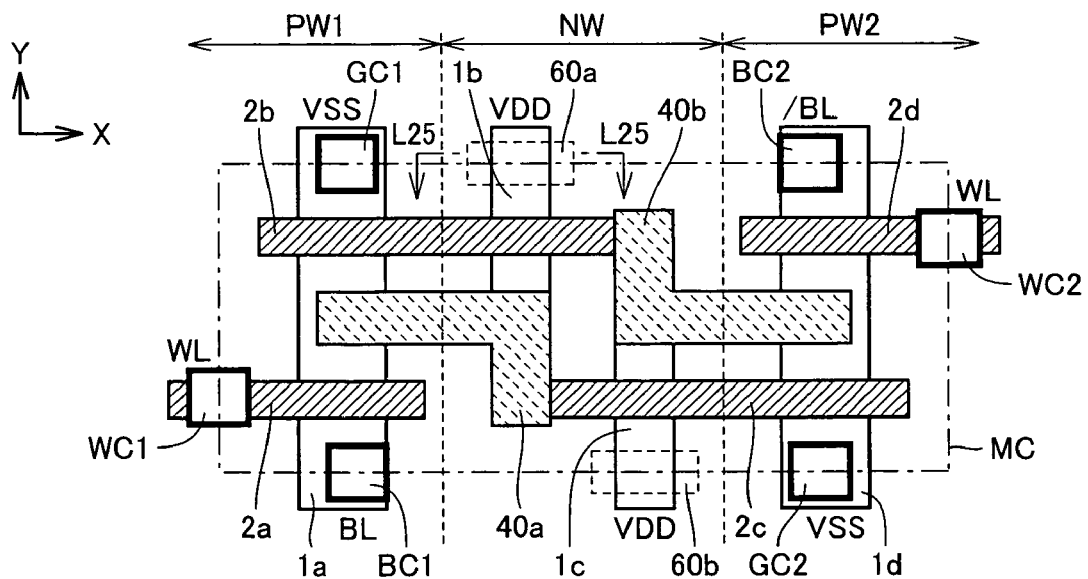
FIG. 24 is a diagram schematically showing the interconnection layout from the substrate to contacts in a memory cell according to the fourth embodiment of the present invention.

FIG. 24 is a diagram schematically showing the interconnection layout of a memory cell according to the fourth embodiment of the present invention. FIG. 24 shows the interconnection layout after the formation of polysilicon lines and contacts. The interconnection layout shown in FIG. 24 is different from the interconnection layout shown in FIG. 19 in the following points. Specifically, common source/well contacts 60a and 60b are provided in active regions 1b and 1c instead of contacts VC1 and VC2, respectively. Other portions in the arrangement and the components of the interconnection layout shown in this FIG. 24 are the same as in the interconnection layout of the memory cell shown in FIG. 19, and the same reference numerals are attached to corresponding portions, and detailed descriptions thereof are not repeated.

High side power supply voltage VDD is supplied to the end portions of active regions 1b and 1c. In addition, power supply voltage VDD is usually supplied to N well NW as a substrate bias voltage, so that the junction between the source/drain region and the substrate region of the P channel MOS transistor which is formed in N well NW can be prevented from entering a forward bias state. The substrate bias voltage supplied to the N well NW is used as the high side power supply voltage of the memory cell.

Figure 25:
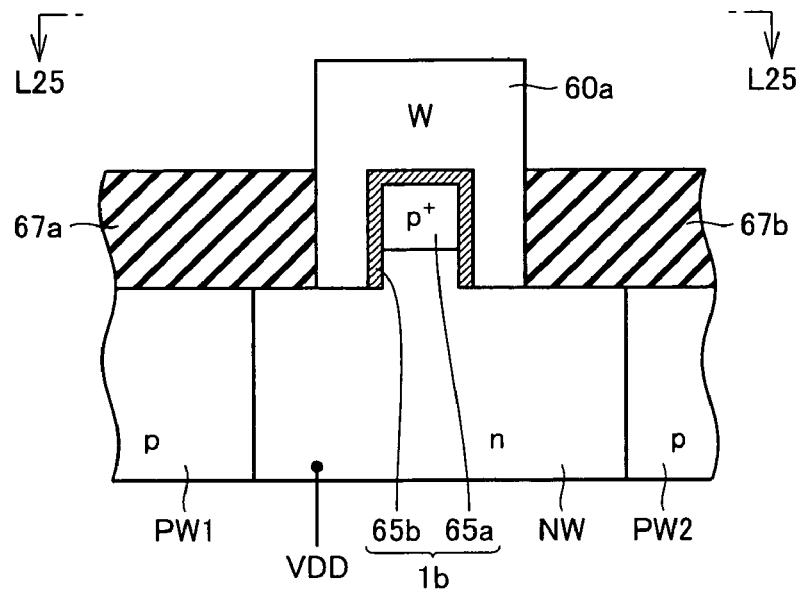
FIG. 25 is a diagram schematically showing a cross sectional structure of the shared source/well contacts shown in FIG. 24.

FIG. 25 is a diagram schematically showing a cross sectional structure of common source/well contacts 60a and 60b shown in FIG. 24. These common source/well contacts 60a and 60b have the same structure in a cross section, and therefore, FIG. 24 shows a cross section structure taken along line L25-L25, for schematically showing a typical structure of common source/well contact 60a formed in active region 1b.

A P type high concentration impurity region 65a is formed on the surface of N well NW. A silicide film 65b is formed covering the surface and the sides of this high concentration impurity region 65a. In this contact region, etching is applied, so that the surface of N well NW is exposed and a contact hole is formed. In the contact hole portion, N well NW is etched and partially removed so that a step portion is formed, and silicide film 65b is formed further covering the side walls of the protrusion of the exposed N well NW.

These high concentration impurity region 65a and silicide film 65b form active region 1b. In the contact hole portion, a metal line is formed of, for example, tungsten W, and covers active region 1b (impurity region 65a and silicide film 65b) and the side walls of the N well protrusion, and makes contact with N well NW as common source/well contact 60a.

Field insulating films 67a and 67b for element isolation are formed on the surface of N well NW and on the surface of adjacent P wells PW1 and PW2, excluding the contact hole portion. This common source/well contact 60a is isolated from other regions where components are formed by means of field insulating films 67a and 67b. High side power supply voltage VDD is supplied to N well NW. Power supply voltage VDD supplied to N well NW is transferred to high concentration impurity region 65a through common source/well contact 60a. Accordingly, high side power supply voltage VDD is supplied from the well region to the power supply node of the load transistors. Thus, it becomes unnecessary to separately interconnect a VDD source line for transferring power supply voltage VDD, and the interconnection requirements can be mitigated.

Here, as described above, common source/well contact 60b has the same structure in a cross section as common source/well contact 60a shown in FIG. 25.

Figure 26:
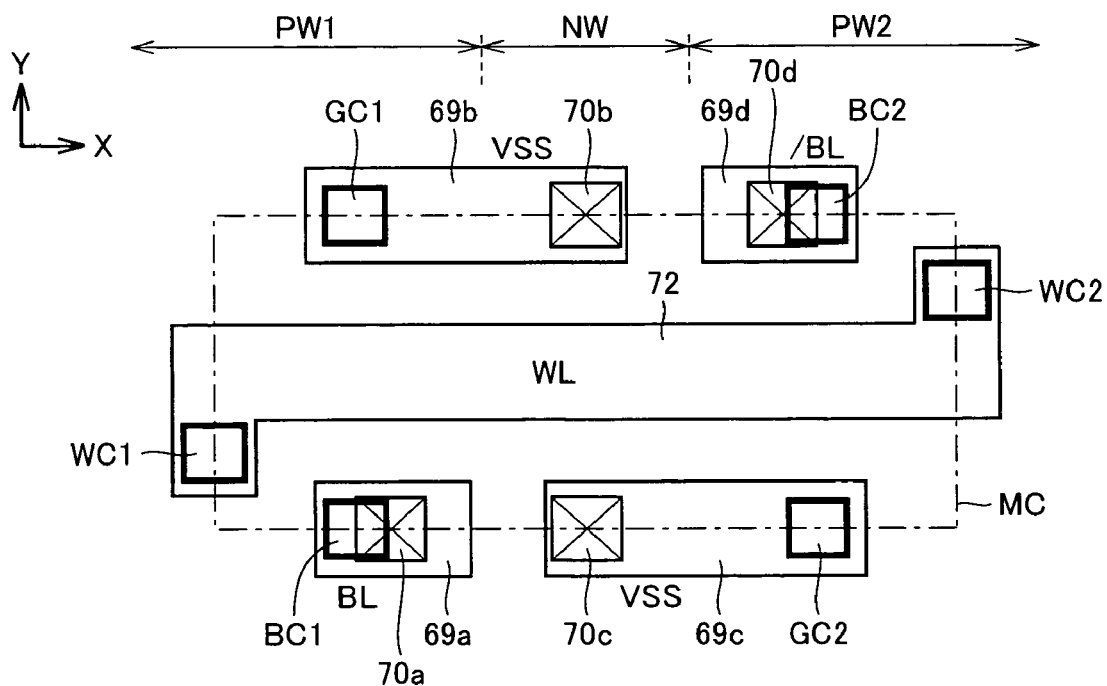
FIG. 26 is a diagram schematically showing the layout of first metal lines in a layer above the interconnection layout shown in FIG. 24.

FIG. 26 is a diagram schematically showing the layout of first metal lines and vias in a layer above the interconnection layout shown in FIG. 24. FIG. 26 also shows the contacts shown in FIG. 24, with the same reference numerals attached. First metal lines 69a to 69d are formed in a rectangular form extending in X direction within the memory cell region and corresponding to contacts BC1, GC1, GC2 and BC2, respectively.

Vias 70a to 70b for the connection with interconnection lines in an upper layer are further formed for these first metal lines 69a to 69d, respectively. Vias 70b and 70c. for transferring low side power supply voltage VSS are provided extending linearly in Y direction. Contacts WC1 and WC2 for the connection with a word line are connected to each other through a first metal line 72 extending in X direction and crossing memory cell MC. The first metal line 72 continuously extends in X direction. Memory cells MC are arranged in a mirror symmetrical layout in X direction, and similarly, in the second metal line that constitutes word line WL, protrusions for making contact with polysilicon lines in a lower layer are placed at mirror symmetrical positions in X direction for the memory cells.

Figure 27:
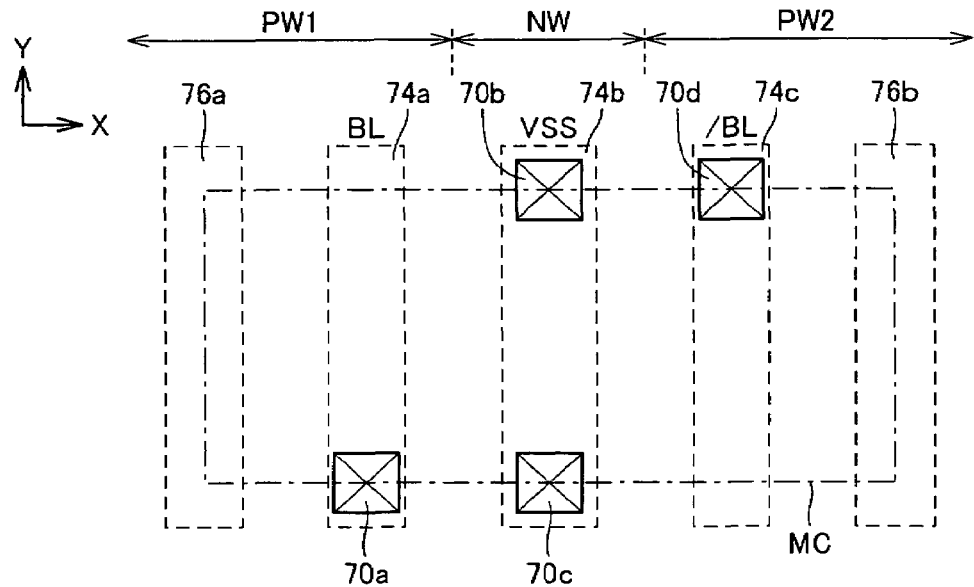
FIG. 27 is a diagram schematically showing the layout of second metal lines in a layer above the interconnection layout shown in FIG. 24.

FIG. 27 is a diagram showing the layout of the second metal lines in a layer above the interconnection layout shown in FIG. 26. FIG. 27 also shows vias 70a to 70d shown in FIG. 26. In FIG. 27, second metal lines 74a to 74c are provided apart from each other and continuously extending in Y direction in the memory cell MC region. Second metal line 74a is connected to via 70a and constitutes a bit line BL. Second metal line 74b is connected to vias 70b and 70c, and constitutes a VCC source line. Second metal line 74c is connected to via 70b and constitutes a bit line /BL.

Second metal lines 76a and 76b are provided parallel to these second metal lines 74a to 74c and extending in Y direction in the memory cell boundary regions in X direction. These second metal lines 76a and 76b are used as power supply lines for transferring power supply voltage VDD and may be used to reinforce the power supply or as a global bit line in a hierarchical bit line structure. In addition, they may be simply used as passing interconnection lines fixed to the power supply voltage and used as shielding lines for preventing crosstalk between bit lines in adjacent columns.

Figure 28:
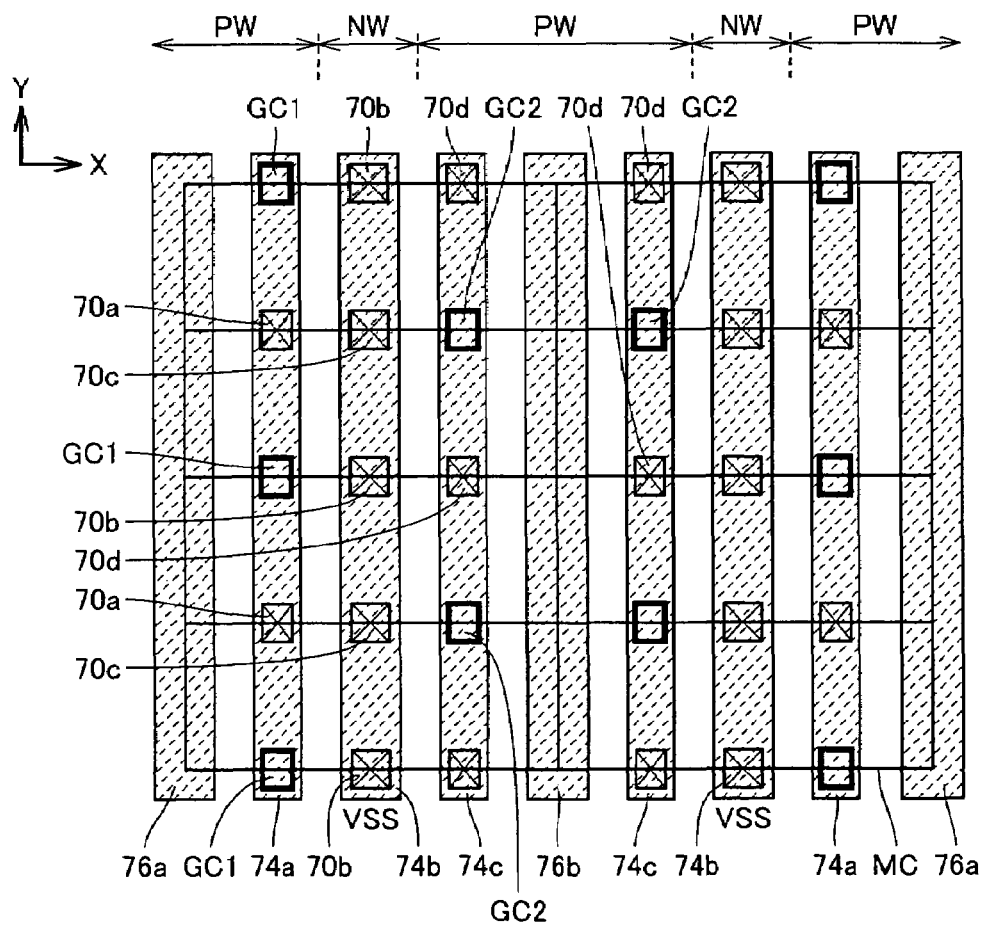
FIG. 28 is a diagram schematically showing the layout of second metal lines in a plurality of memory cells according to the fourth embodiment of the present invention.

FIG. 28 is a diagram showing the layout of second metal lines for a plurality of memory cells according to the fourth embodiment of the present invention. FIG. 28 shows a typical interconnection layout for memory cells MC are disposed in four rows and two columns and the arrangement of well regions PW and NW. In FIG. 28, the same reference numerals are attached to the portions corresponding to those in the configuration shown in FIG. 27.

In FIG. 28, second metal lines 74a to 74c are provided apart from each other and continuously extending in Y direction. In second metal lines 74a corresponding to bit lines BL, source contacts GC1 and bit line vias 70a are alternately arranged aligning in a line along second metal lines 74a. Vias 70b are arranged, on the boundaries of the memory cells, being aligned in Y direction for second metal lines 74b constituting the VSS source lines. Second metal lines 74b are electrically connected to source contacts GC1 via first metal lines 69b as shown in FIG. 26.

Second metal lines 74c constitutes bit lines /BL, and vias 70d and source contacts GC2 are alternately arranged in Y direction aligned in a line along the second metal lines 74c. Source contacts GC2 are electrically connected to second metal lines 74b via first metal lines 69c as shown in FIG. 26. Accordingly, VSS source lines have a tree-like structure with a power supply trunk line portion that extends linearly, and branch lines which branch from the power supply trunk line portion in each memory cell region.

Second metal lines 76a and 76b which continuously extend in Y direction are alternately placed in X direction X in the boundary regions between the memory cell columns.

These second metal lines 74a to 74c are repeatedly placed in the mirror symmetrical layout for each memory cell column along X direction.

In the arrangement shown in FIG. 27, as shown in FIG. 28, VSS source lines are each formed by a second metal line 74b extending linearly in Y direction and a first metal line (69b, 69c) electrically connected to second metal line 74b within the memory cell region, and as in the previously described first to third embodiments, source node voltage VSS of the driver transistors can be adjusted in memory cell column units. In addition, the source nodes of the driver transistors in each memory cell are interconnected with each other, so that the difference in the memory cell source potential can be suppressed.

"First Modification of Common Source/Well Contact"

Figure 29:
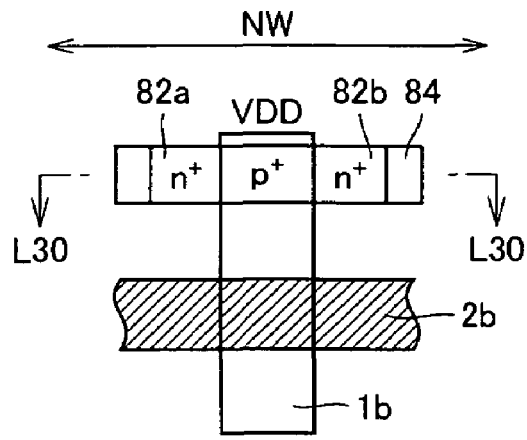
FIG. 29 is a diagram schematically showing the layout of the shared source/well contacts according to a modification of the fourth embodiment of the present invention.

FIG. 29 is a diagram schematically showing the plan layout of a modification of the common source/well contact according to the fourth embodiment of the present invention. In FIG. 29, high concentration n type impurity regions 82a and 82b are placed on both sides of active region 1b formed within N well NW and adjacently to active region 1b. A silicide film 84 is formed on the surface of these impurity regions 82a and 82b as well as the active region. This silicide film 84 supplies high side power supply voltage VDD to N well NW via impurity regions 82a and 82b, and to active region 1b. First metal line 1b arranged crossing active region 1b forms a gate electrode of a load transistor in the memory cell, and accordingly, a power supply voltage can be supplied from the N well region to the source node of the load transistor in the memory cell.

Figure 30:
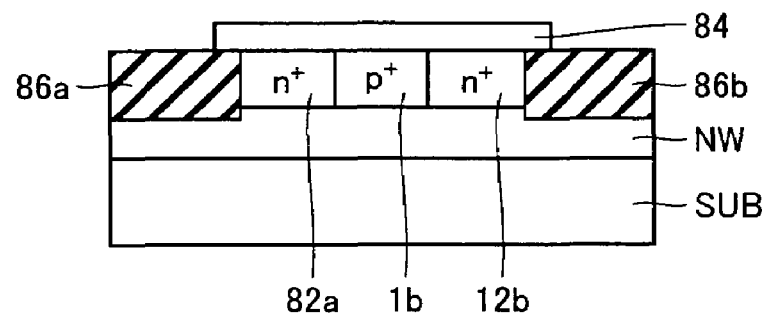
FIG. 30 is a diagram schematically showing a cross sectional structure along line L30-L30 of FIG. 29.

FIG. 30 is a diagram schematically showing a cross sectional structure taken along line L30-L30 shown in FIG. 29. In FIG. 30, a P type active region 1b is formed on the surface of N well NW that is formed on the surface of semiconductor substrate SUB, and high concentration N type impurity regions 82a and 82b are formed on both sides of P type active region 1b. Element isolation films 86a and 86b are formed at outer periphery of impurity regions 82a and 82b.

A silicide film 84 is continuously formed on the surface of impurity region 82a, active region 1 and impurity region 82b, so that these impurity regions 82a and 82b, as well as active region 1b, are electrically connected.

Here, an element isolation film may be formed between active region 1b and impurity regions 82a and 82b.

"Second Modification of Common Source/Well Contact"

Figure 31:
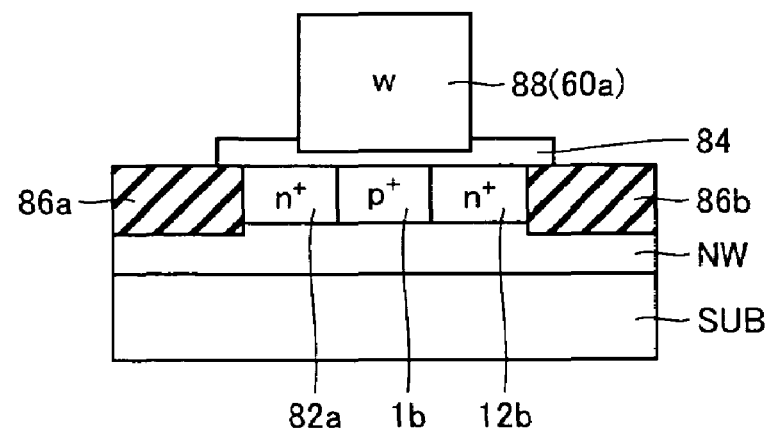
FIG. 31 is a diagram schematically showing the layout of the shared source/well contacts according to another modification of the fourth embodiment of the present invention.

FIG. 31 is a diagram showing the configuration of the second modification of the common source/well contact according to the fourth embodiment of the present invention. In the configuration shown in FIG. 31, a high melting point metal (refractory metal) film 88, such as tungsten W, is formed on the surface of silicide film 84 as an intermediate layer for supplying the high side power supply voltage. This high melting point metal film 88 corresponds to high melting point metal film 60a shown in FIG. 25. The other portions of the configuration shown in FIG. 31 are the same as those in the configuration shown in FIG. 30, and the same reference characters are allotted to corresponding portions, and detailed descriptions thereof are not repeated.

In the configuration shown in this FIG. 31 also, bias voltage VDD supplied to N well NW can be used as a memory cell power supply voltage.

Figure 32:
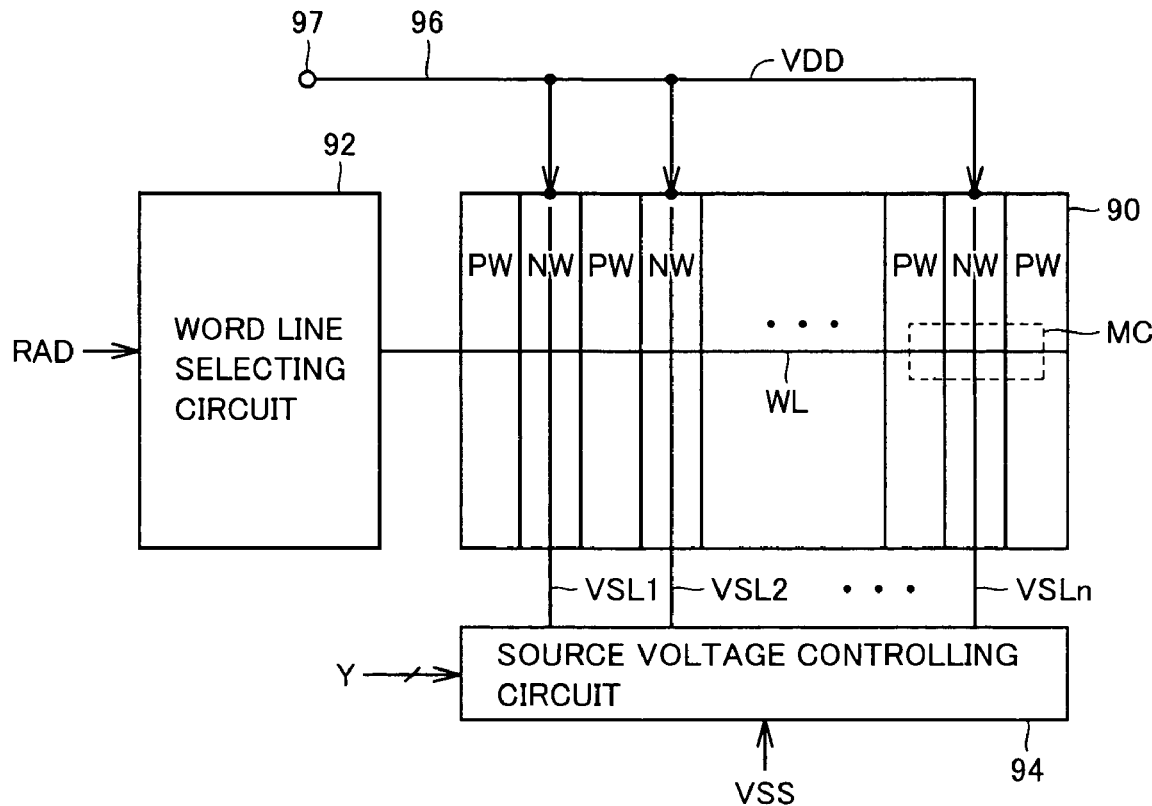
FIG. 32 is a diagram schematically showing the configuration of a main portion of a semiconductor memory device according to the fourth embodiment of the present invention.

FIG. 32 is a diagram schematically showing the configuration of a main portion of the semiconductor memory device according to the fourth embodiment of the present invention. In FIG. 32, the semiconductor memory device includes a memory cell array 90 having memory cells MC disposed in rows and columns. In memory cell array 90, P wells PW and N wells NW are arranged as substrate regions such that N well NW is sandwiched between P wells PW. These well regions PW and NW are arranged linearly extending in the direction of the columns of memory cell array 90. VSS source lines VSL are individually provided corresponding to N well NW regions, and transfer source voltage (low side power supply voltage) VSS.

The semiconductor memory device further includes a word line selecting circuit 92 for selecting a word line WL in memory cell array 90 in accordance with a row address signal RAD, and a source voltage controlling circuit 94 for driving the voltage level of VSS source line VSL (VSL1 to VSLn) on a selected column to the ground voltage level (low side power supply voltage VSS) in accordance with a column selecting signal Y, and for maintaining the voltage level of VSS source lines VSL (VSL 1 to VSLn) of unselected columns at a voltage level of, for example, 0.4 V. Column selecting signal Y is generated by decoding the column address signal using a column decoding circuit, not shown.

Power supply voltage VDD is supplied to power supply line 96 coupled to power supply node 97, and the power supply voltage VDD is supplied to N wells NW via the common source/well contact (not explicitly shown in FIG. 32), so that high side power supply voltage VDD is supplied from the corresponding N well NW in for each memory cell column. The power supply node may be a node which receives external power supply voltage, or may be a node receiving an internal power supply voltage that is generated by downconverting the external power supply voltage, or may be a node receiving the external power supply voltage subject to a stabilization process, such as a low pass filtering.

Although low side power supply voltage VSS, for example, is supplied as a bias voltage to P wells PW in memory cell array 90, this route is not shown.

Although the semiconductor memory device shown in this FIG. 32 further includes a column selecting circuit for selecting a bit line (BL, /BL) in the selected column in accordance with a column selecting signal Y, and internal write-in/readout circuit for writing/reading data with the bit lines on the selected column, these circuits are not shown, for the purpose of simplicity of the drawing.

Figure 33:
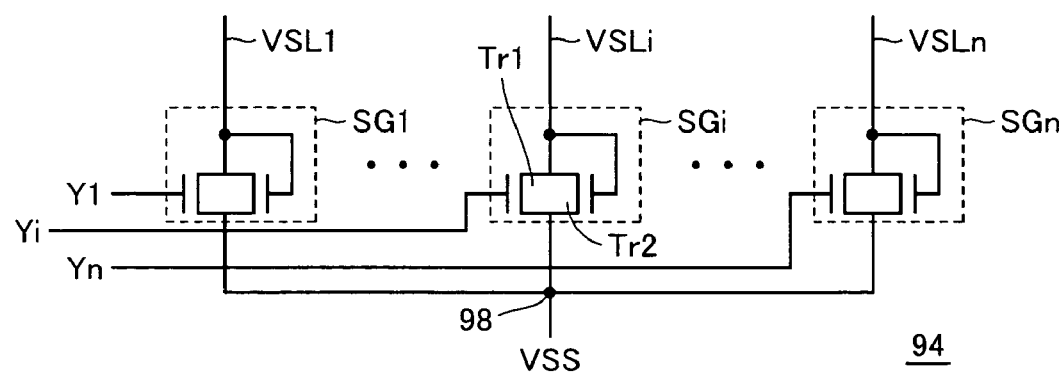
FIG. 33 is a diagram showing an example of the configuration of the source voltage controlling circuit shown in FIG. 32.

FIG. 33 is a diagram showing an example of the configuration of source voltage controlling circuit 94 shown in FIG. 32. In FIG. 33, source voltage controlling circuit 94 includes source voltage switching gates SG1 to SGn provided corresponding to VSS source lines VSL1 to VSLn, respectively. Source voltage switching gates SG1 to SGn have the same configuration, and therefore, in FIG. 33, reference characters are allotted only to the components of source voltage switching gate SGi provided for VSS source line VSLi. Source voltage switching gate SGi includes N channel MOS transistors Tr1 and Tr2 connected in parallel between VSS source line VSLi and low side power supply node 98. MOS transistor Tr1 receives a column selecting signal Yi at its gate, and the gate of MOS transistor Tr2 is connected to corresponding VSS source line VSLi.

MOS transistor Tr2 operates in a diode mode and maintains corresponding VSS source line VSLi at a voltage level higher than low side power supply voltage VSS by threshold voltage Vth of MOS transistor Tr2. MOS transistor Tr1 is made conductive when column selecting signal Yi is in the selected state, and transfers low side power supply voltage VSS to corresponding VSS source line VSLi when in conductive state. When corresponding column selecting signal Yi is in the unselected state, MOS transistor Tr1 is in a non-conductive state.

Accordingly, VSS source line VSL (VSL1 to VSLn) in the selected column is set at the low side power supply voltage VSS level, and VSS source lines VSL (VSL1 to VSLn) in the unselected columns are set at the voltage level of threshold voltage Vth. This threshold voltage Vth is, for example, 0.4 V.

Figure 34:
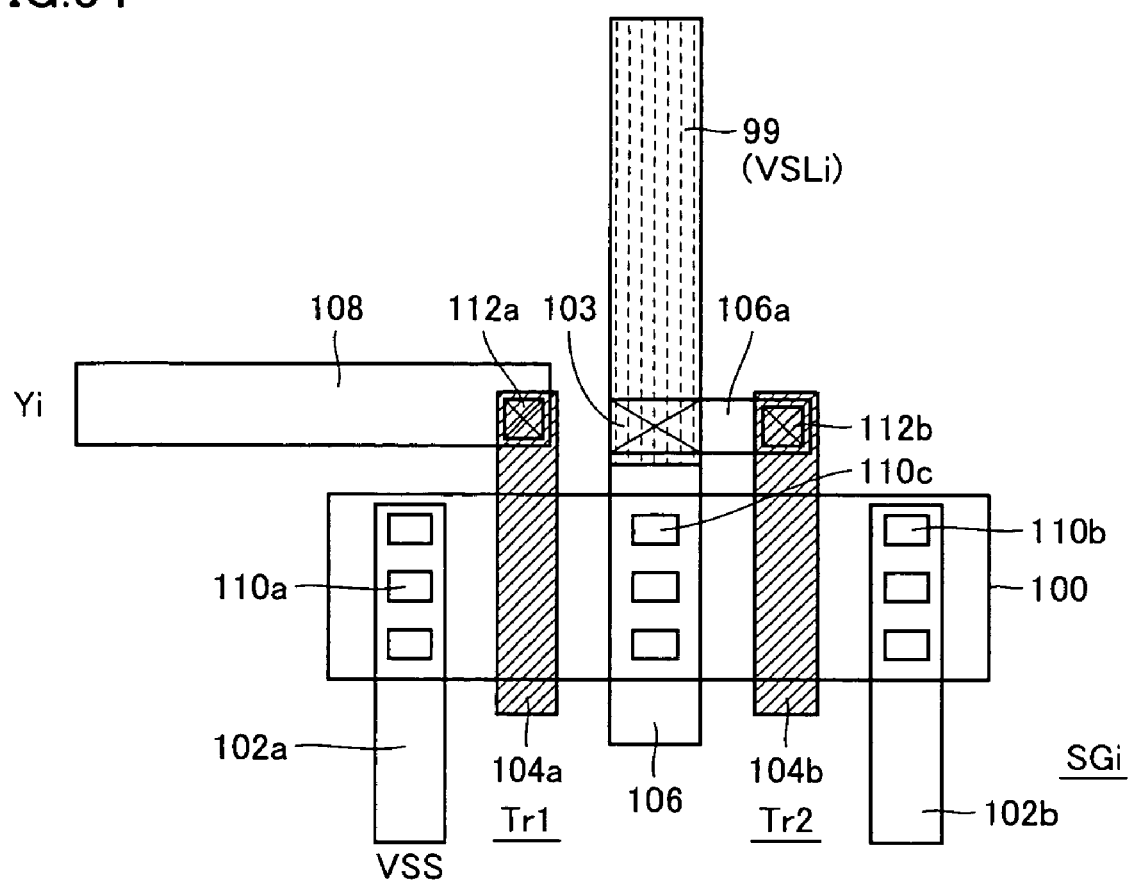
FIG. 34 is a diagram schematically showing a planar layout of the source line voltage switching gate shown in FIG. 33.

FIG. 34 is a diagram schematically showing a planar layout of source line voltage switching gate SGi shown in FIG. 33. In FIG. 34, source voltage switching gate SGi is formed within an active region 100. A first metal line 106 is placed in the middle of active region 100. This first metal line 106 is electrically connected to active region 100 via a contact 110c and is electrically connected, through a via 103, to a second metal line 99 constituting VSS source line VSLi.

Gate electrode lines 104a and 104b are formed of, for example, polysilicon, and are provided on both sides of first metal line 106. Gate electrode wire 104a is electrically connected to a first metal line 108 through a via 112a, and gate electrode line 104b is electrically connected to second metal line 99 through a via 112b, a first metal line 106a and a via 103. First metal line 106a may be formed continuously with first metal line 106.

First metal lines 102a and 102b are provided respectively in the regions at opposite end sides of active region 100, and these first metal lines 102a and 102b are connected to active regions in a lower layer via contacts 110a and 110b, respectively. These first metal lines 102a and 102b are both electrically connected to low side power supply node 98 shown in FIG. 33 and transfer low side power supply voltage VSS.

MOS transistor Tr1 is constructed by a gate electrode line 104a, first metal lines 102a and 106, and active region 100 in a layer beneath these lines, while MOS transistor Tr2 is constructed by gate electrode line 104a, first metal lines 102a and 106, and active region 100 in a layer beneath these lines As shown in this FIG. 34, according to the fourth embodiment, VSS source line VSLi can be formed by scond metal line 99, and VSS source line VSLi can be electrically connected to first metal line 106 constructing drain nodes of transistors Tr1 and TR2 for switching the source voltage through one via 103. Accordingly, connection defect (contact defect) in the connection portion between VSS source line and the transistors of source voltage switching gate SGi, as well as increase in the resistance value (contact resistance), can be prevented, as compared to a configuration where a plurality of vias are used for the electrical connection. Thus, the voltage level of VSS source lines VSL can be set stably to a desired voltage level, and the reliability of the source voltage switching portion can be improved.

The configuration of the entirety of the semiconductor memory device shown in this FIG. 32 can also be applied to the semiconductor memory devices shown in the first to third embodiments. In the case of a dual port SRAM, word line selecting circuits 92 are separately provided for A port and for B port. In addition, voltage control of VS source line VSL in the selected column is performed by source voltage controlling circuit 94 in accordance with column address signals from both A port and B port.

In addition, the interconnection layouts shown in FIGS. 24, 26 and 27 can be applied to dual port SRAM cells similarly. In the case of a dual port memory cell, A port access transistors and B port access transistors are provided in P wells PW1 and PW2, respectively.

As described above, according to the fourth embodiment of the present invention, a common source/well contact is provided in each region where a memory cell is formed, so that the bias voltage for the N well is used as the memory cell power supply voltage, and thereby, it becomes unnecessary to provide a interconnection line for transferring power supply voltage VDD on memory cell array 90, the number of interconnection layers is reduced, the manufacturing cost is reduced, the yield can be improved, and furthermore, freedom in design of interconnection above the memory cell array can be increased, and further, the same effects as in the first embodiment can be achieved The present invention can be generally applied to SRAM's in which memory cells have a flip-flop structure. In particular, the invention can be applied to embedded SRAM's, such as system on chip, and a static type semiconductor memory device consuming little current can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell array including a plurality of memory cells, arranged in rows and columns, each including (1) a pair of load transistor elements of a second conductivity type formed in a first substrate region of a first conductivity type, each load transistor having a first conduction node coupled to a power supply node to which a first power supply voltage is supplied through a first power supply line, and (2) drive transistor elements of the first conductivity type formed in respective second substrate regions of the second conductivity type arranged on opposite sides of the first substrate region of the first conductivity type, the drive transistors being connected so as to form a flip-flop with the load transistor elements and having first conduction nodes connected together to receive a second power supply voltage;
second power supply lines provided to respective memory cell columns for supplying the second power supply voltage to the drive transistor elements in the plurality of memory cells, each second power supply line continuously extending in a column direction of the memory cell array, and crossing over the first substrate region of each memory cell in a corresponding memory cell column to connect together the first conduction nodes of the drive transistor elements;
a plurality of word lines, provided corresponding to the respective memory cell rows, each connecting to the memory cells on a corresponding row; and
a plurality of bit lines, provided corresponding to the memory cell columns, each having the memory cells on a corresponding memory cell column connected, wherein
said second power supply lines provided to the respective memory cell columns are isolated from each other.

2. The semiconductor memory device according to claim 1, wherein the first power supply line is formed by a second metal line for supplying said first power supply voltage,
the bit lines are each formed by a second power interconnection line that is in a same layer as said first power supply line,
each of the memory cells further comprises an access transistor of the first conductivity type formed in each of the second substrate regions, and selectively made conductive in response to a voltage on the word line in a corresponding row for coupling a corresponding drive transistor element to a corresponding bit line when made conductive, and
each second power supply line comprises a first metal line placed in a layer below the second metal lines constituting the bit line and said first power supply line.

3. The semiconductor memory device according to claim 1, wherein
each second power supply line comprises an interconnection line placed in a layer below conductive lines constituting said bit lines, and
the word lines comprise interconnection lines placed in a layer above the conductive lines constituting the bit lines.

4. The semiconductor memory device according to claim 1, wherein
said power supply node comprises an impurity region of the first conductivity type formed in the first substrate region, and a conductive layer for electrically connecting said impurity region of the first conductivity type to an impurity region of the second conductivity type constituting the first conduction node of each load transistor.

5. The semiconductor memory device according to claim 4, wherein
said second power supply lines and said bit lines are formed in a first interconnection layer, and
the word lines each comprise an interconnection line formed in a second interconnection layer below said first interconnection layer.

6. The semiconductor memory device according to claim 1, wherein
each of the memory cells further comprises first and second access transistors, formed in each second substrate region, each made selectively conductive in accordance with a voltage of a control electrode node thereof,
each word line comprises first and second word lines provided corresponding to the first and second access transistors, respectively, and connected to the control electrode nodes of the respective first and second access transistors, and
each bit lines comprise first and second bit lines connected to the first and second access transistors, respectively.

7. The semiconductor memory device according to claim 1, wherein the first power supply line comprises a power line arranged extending in a direction of the columns for each column and coupled to the power supply nodes of the load transistors of memory cells in a corresponding column.

8. The semiconductor memory device according to claim 1, further comprising a voltage controlling circuit for setting a voltage of each second power supply line in accordance with a column selecting signal for each column.

9. The semiconductor memory device according to claim 1, wherein the first conduction nodes of the pair of drive transistors are placed in respective portions of the memory cell boundary regions opposite to each other in a column extending direction in each memory cell, and each second power supply line comprises an interconnection line formed into a step form having portions that continuously extends in the column direction and a row direction within each memory cell and connecting the first conduction nodes of the drive transistor elements in a corresponding memory cell, said second power supply line extending in a zigzag form continuously in the column extending direction, for supplying the second power supply voltage to the memory cells in a corresponding column.

10. The semiconductor memory device according to claim 1, wherein each second power supply line comprises a first conductive line extending in the column direction commonly to the memory cells in each column and a second conductive line formed in a layer below said first conductive line and electrically coupling the first conduction nodes of the drive transistor elements to the first conductive line in each memory cell in a corresponding column.

11. A semiconductor memory device comprising:

a memory cell array including a plurality of memory cells, arranged in rows and columns, each memory cell including (1) a pair of load transistor elements of a second conductivity type formed in a first substrate region of a first conductivity type, each load transistor element having a first conduction node coupled to a power supply node to which a first power supply voltage is supplied through a first power supply line, and (2) a pair of drive transistor elements of the first conductivity type formed in respective second substrate regions of the second conductivity type arranged on opposite sides of the first substrate region of the first conductivity type, the drive transistors being connected so as to form a flip-flop with the load transistor elements and having second conduction nodes connected together to receive a second power supply voltage; and (3) a pair of access transistor elements of the first conductivity type formed in respective second substrate regions of the second conductivity type arranged on opposite sides of the first substrate region of the first conductivity type, each access transistor being made selectively conductive in accordance with a voltage of a control electrode node thereof;

second power supply lines provided to respective memory cell columns for supplying the second power supply voltage to the drive transistor elements in the plurality of memory cells, each second power supply line continuously extending along a corresponding memory cell column, and crossing over the first substrate region of each memory cell in the corresponding memory cell column to connect together the first conduction nodes of the drive transistor elements;

a plurality of word lines, provided corresponding to the respective memory cell rows, each connecting to the memory cells on a corresponding row; and a plurality of bit lines, provided corresponding to the memory cell columns, each having the memory cells on a corresponding memory cell column connected; wherein each second power supply line is isolated from another second power supply line of an adjacent memory cell column in the memory cell array.

* * * * *